United States Patent
Noguchi et al.

(10) Patent No.: US 10,083,729 B2
(45) Date of Patent: Sep. 25, 2018

(54) MAGNETIC MEMORY AND MEMORY SYSTEM

(71) Applicant: Toshiba Memory Corporation, Minato-ku (JP)

(72) Inventors: Hiroki Noguchi, Yokohama (JP); Shinobu Fujita, Tokyo (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/705,815

(22) Filed: Sep. 15, 2017

(65) Prior Publication Data

US 2018/0144782 A1 May 24, 2018

(30) Foreign Application Priority Data

Nov. 21, 2016 (JP) .................................. 2016-226364

(51) Int. Cl.
  *G11C 11/00* (2006.01)
  *G11C 11/16* (2006.01)
  (Continued)

(52) U.S. Cl.
  CPC ........ *G11C 11/1673* (2013.01); *H01L 27/228* (2013.01); *H01L 43/02* (2013.01);
  (Continued)

(58) Field of Classification Search
  CPC . G11C 11/1673; G11C 11/5607; G11C 11/56; G11C 2013/005
  See application file for complete search history.

(56) References Cited

U.S. PATENT DOCUMENTS

2004/0042263 A1* 3/2004 Sharma .................. G11C 11/56 365/158
2005/0195644 A1* 9/2005 Ikegawa ................ G11C 11/16 365/154

(Continued)

FOREIGN PATENT DOCUMENTS

JP 5173706 B2 1/2013
JP 5502692 B2 3/2014

OTHER PUBLICATIONS

Gitae Jeong, et al., "A 0.24-/spl mu/m 2.0-V 1T1MTJ 16-kb Nonvolatile Magnetoresistance RAM with Self-Reference Sensing Scheme" IEEE Journal of Solid-State Circuits, vol. 38, No. 11, Nov. 2003, pp. 1906-1910.

(Continued)

*Primary Examiner* — Tuan T Nguyen
(74) *Attorney, Agent, or Firm* — Oblon, McClelland, Maier & Neustadt, L.L.P.

(57) ABSTRACT

According to one embodiment, a magnetic memory includes: a first magnetoresistive effect element having a first resistance state or a second resistance state; and a read circuit. A read circuit is configured to apply the first read voltage to the first magnetoresistive effect element, hold a first charging potential caused by the first read voltage, apply a second read voltage higher than the first read voltage to the first magnetoresistive effect element, hold a second charging potential caused by the second read voltage, and determine whether the first magnetoresistive effect element is in the first resistance state or the second resistance state based on a comparison result between the first charging potential and the second charging potential.

20 Claims, 21 Drawing Sheets

(51) Int. Cl.
  *H01L 43/08* (2006.01)
  *H01L 43/02* (2006.01)
  *H01L 27/22* (2006.01)
  *H01L 43/10* (2006.01)

(52) U.S. Cl.
  CPC .......... *H01L 43/08* (2013.01); *G11C 11/1657* (2013.01); *G11C 11/1675* (2013.01); *G11C 11/1697* (2013.01); *H01L 43/10* (2013.01)

(56) References Cited

U.S. PATENT DOCUMENTS

| | | | |
|---|---|---|---|
| 2008/0205124 A1* | 8/2008 | Inaba | G11C 11/16 365/158 |
| 2008/0315335 A1* | 12/2008 | Ueda | G11C 11/16 257/421 |
| 2009/0086532 A1* | 4/2009 | Tsuchida | G11C 5/147 365/158 |
| 2009/0323402 A1 | 12/2009 | Li et al. | |
| 2010/0080054 A1 | 4/2010 | Abe | |
| 2011/0080773 A1 | 4/2011 | El Baraji et al. | |
| 2013/0148406 A1* | 6/2013 | Shimakawa | G11C 11/1673 365/148 |
| 2014/0003137 A1* | 1/2014 | Noshiro | G11C 11/1673 365/158 |
| 2015/0103589 A1* | 4/2015 | Lee | G11C 13/004 365/163 |
| 2015/0348623 A1 | 12/2015 | Lin et al. | |
| 2015/0380086 A1* | 12/2015 | Park | G11C 13/0069 365/148 |

OTHER PUBLICATIONS

Zhenyu Sun, et al., "Voltage Driven Nondestructive Self-Reference Sensing Scheme of Spin-Transfer Torque Memory" IEEE Transactions on Very Large Scale Integration (VLSI) Systems, vol. 20, No. 11, Nov. 2012, pp. 2020-2030.

Safeen Huda, et al., "A Novel STT-MRAM Cell with Disturbance-Free Read Operation" IEEE Transactions on Circuits and Systems—I: Regular Papers, vol. 60, No. 6, Jun. 2013, pp. 1534-1547.

Xuanyao Fong, et al., "Complimentary Polarizers STT-MRAM (CPSTT) for On-Chip Caches" IEEE Electron Device Letters, vol. 34, No. 2, Feb. 2013, pp. 232-234.

Xuanyao Fong, et al., "Low-Power Robust Complementary Polarizer STT-MRAM (CPSTI) for on-chip caches" 5th IEEE International Memory Workshop (IMW), vol. 34, No. 2, 2013, 4 Pages.

Xuanyao Fong, et al., "Non-Volatile Complementary Polarizer Spin-Transfer Torque On-Chip Caches: A Device/Circuit/Systems Perspective" IEEE Transactions on Magnetics, Art. No. 3400611, vol. 50, No. 10, Oct. 2014, 11 Pages.

Seyedhamidreza Motaman, et al., "A Novel Slope Detection Technique for Robust STTRAM sensing" Symposium on Low Power Electronics and Design (ISLPED), 2015, 6 Pages.

* cited by examiner

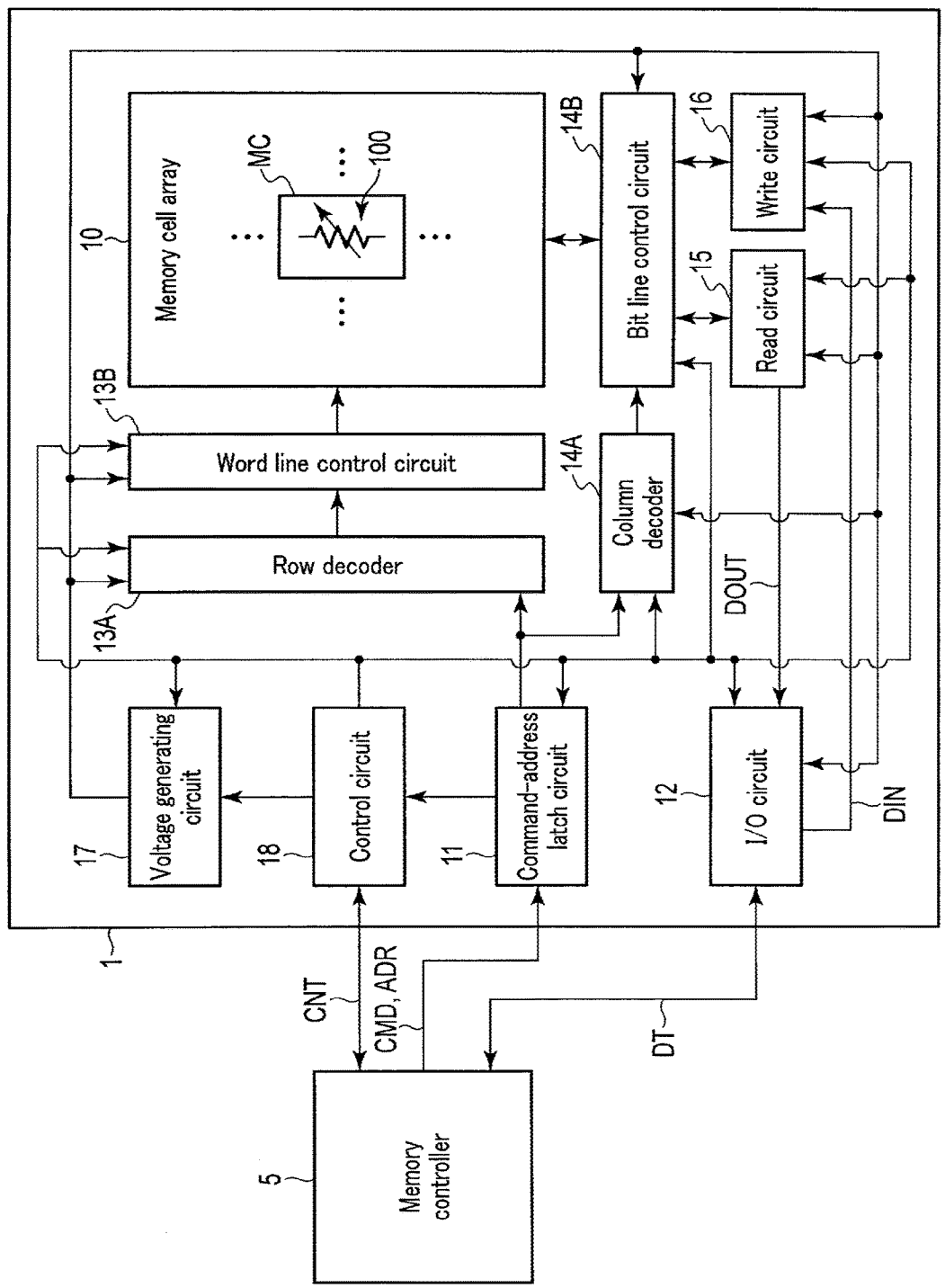
F I G. 1

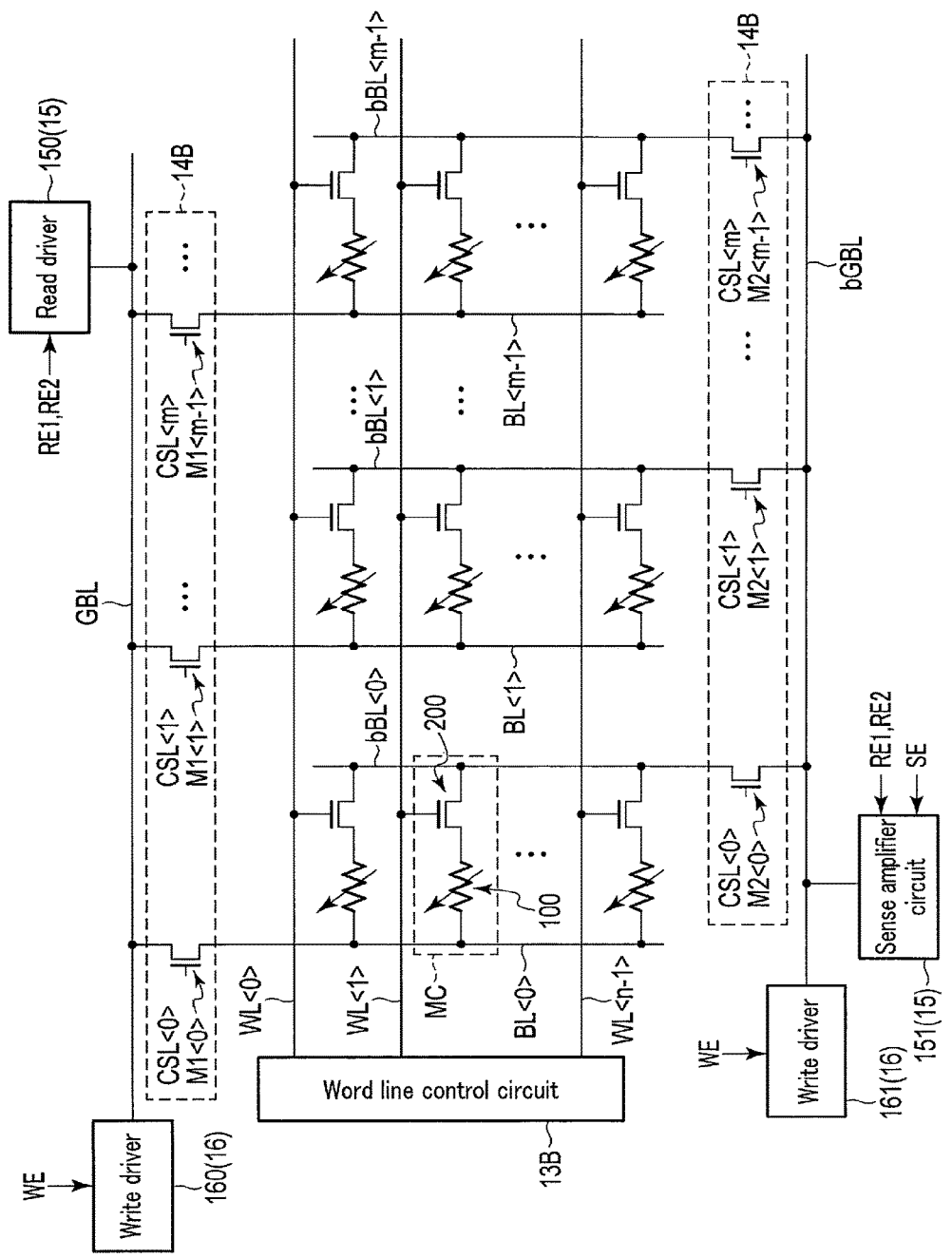
F I G. 2

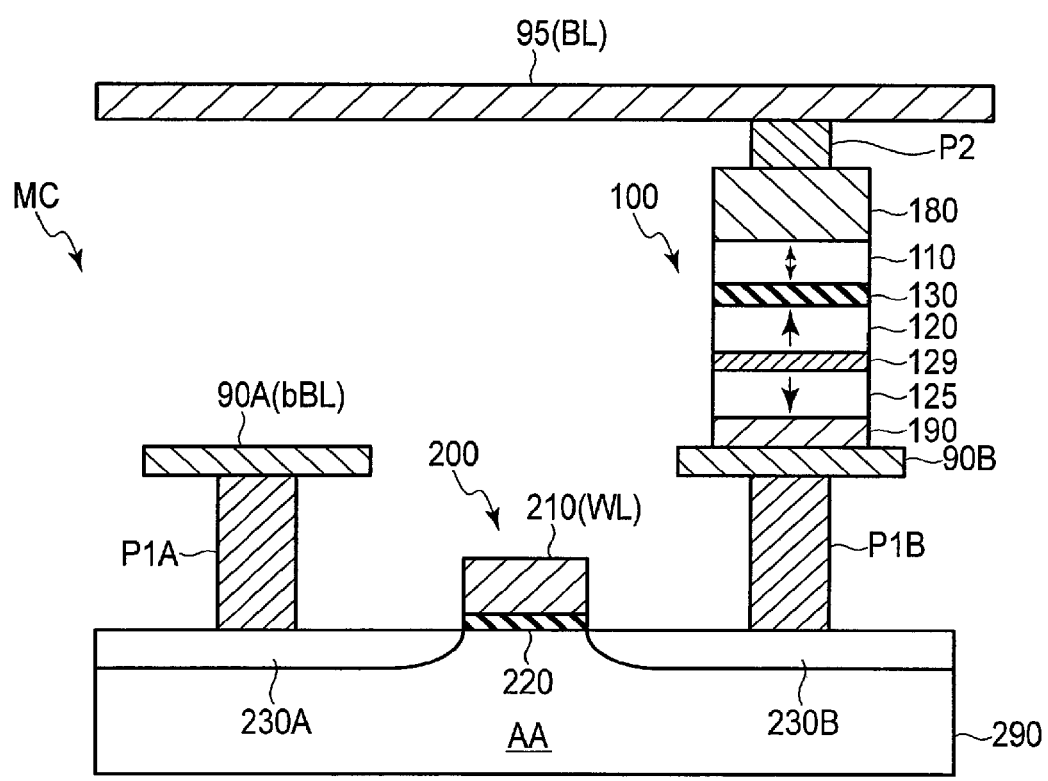
F I G. 3

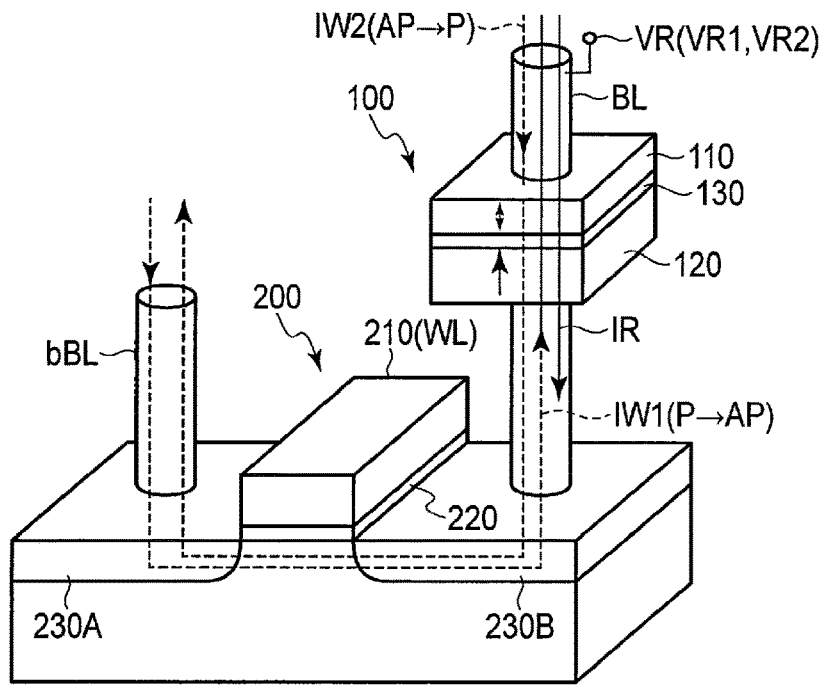
F I G. 4A
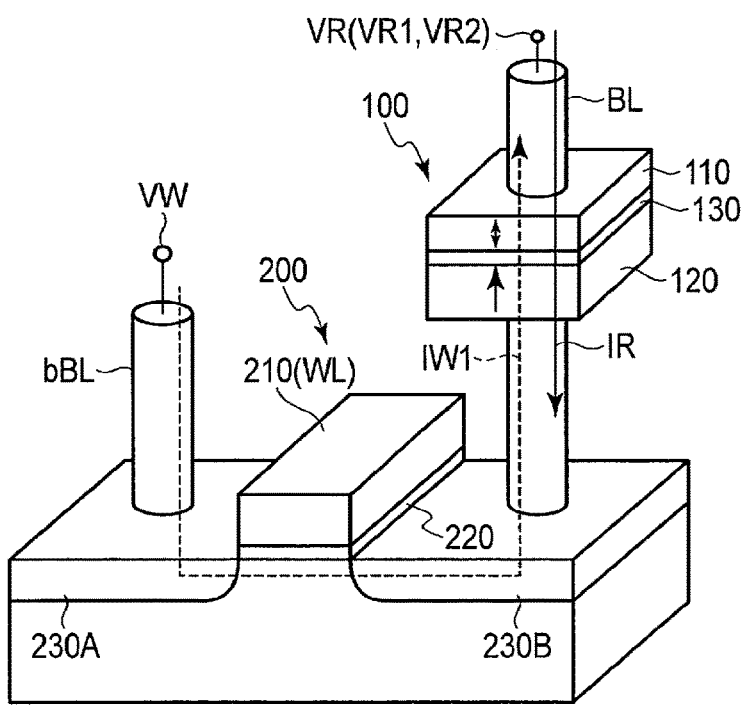
F I G. 4B

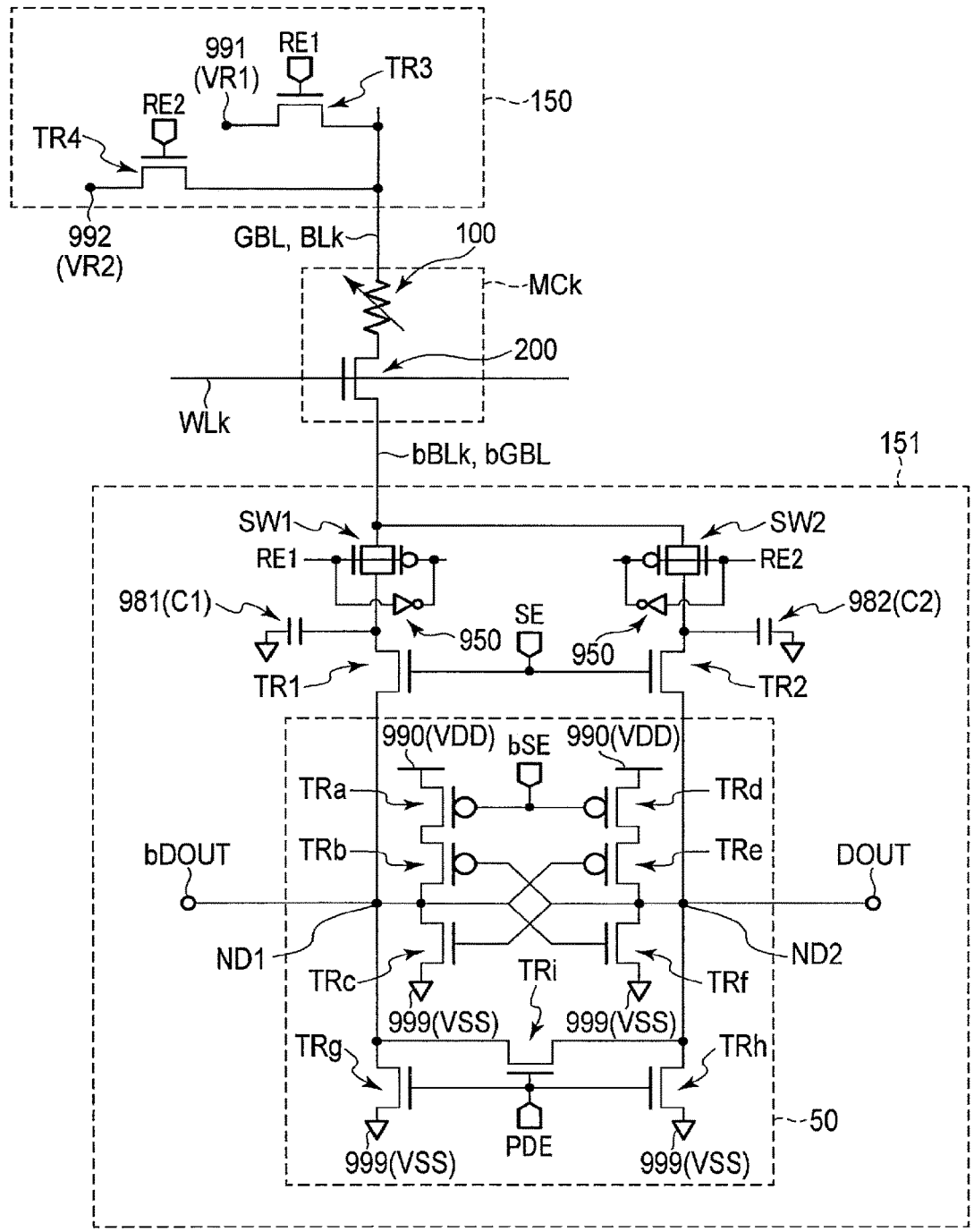
F I G. 8

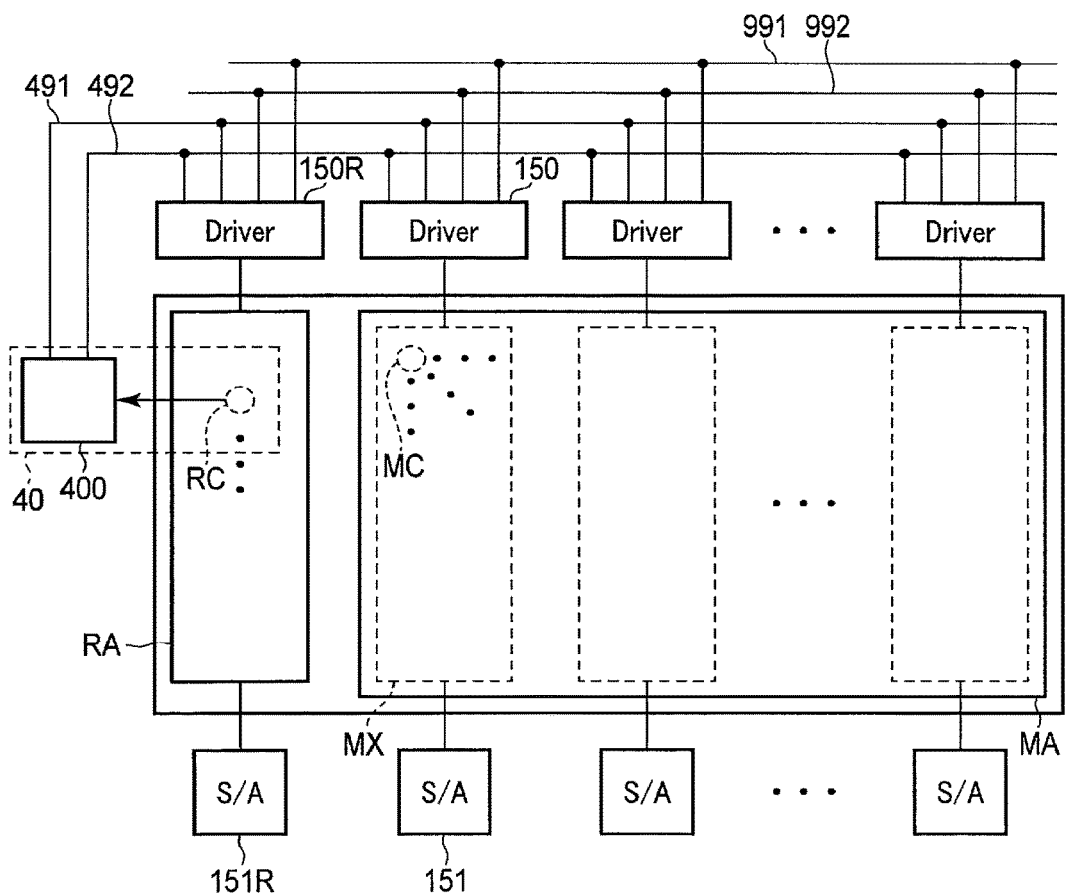
F I G. 12

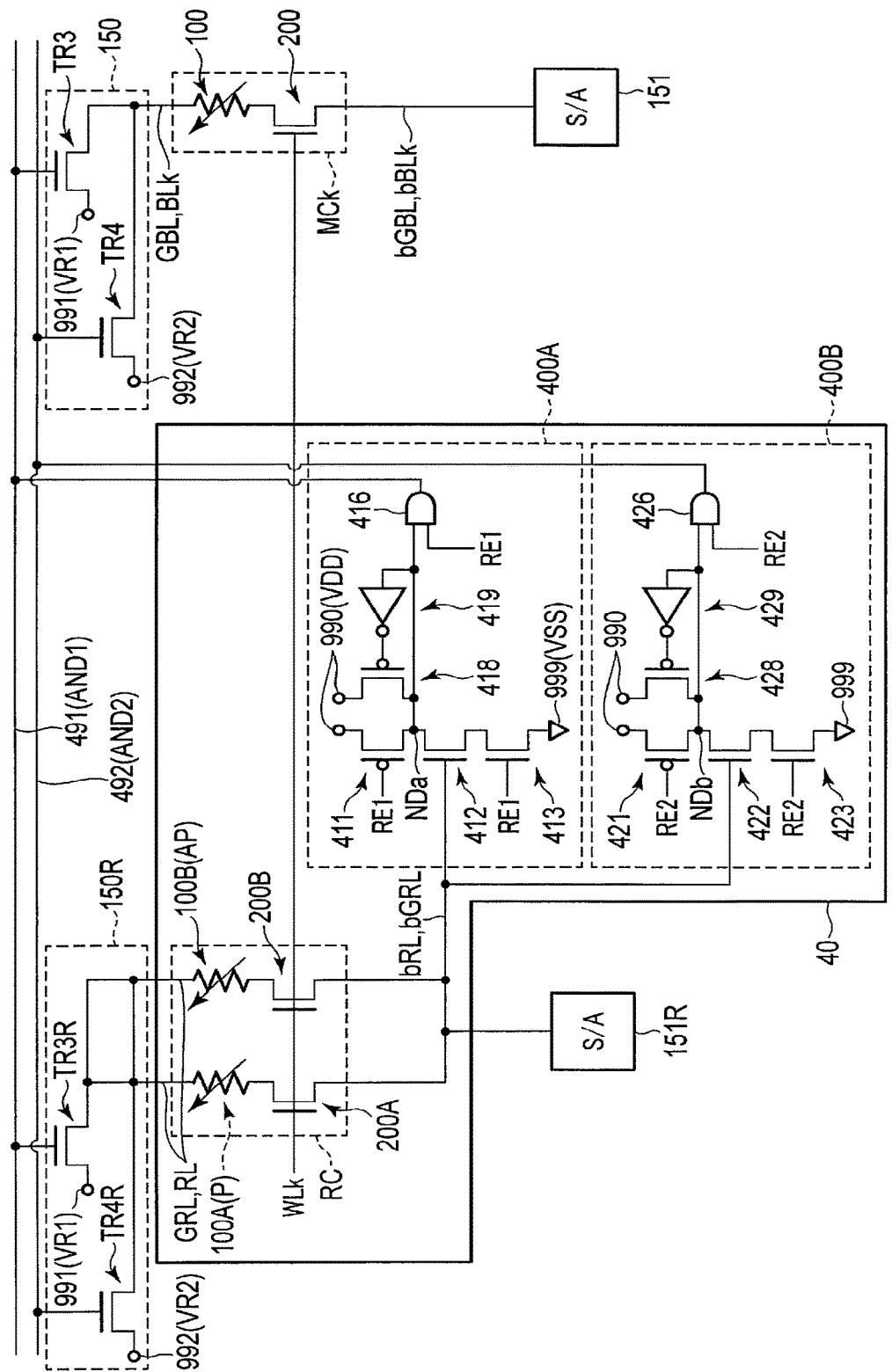
F I G. 13

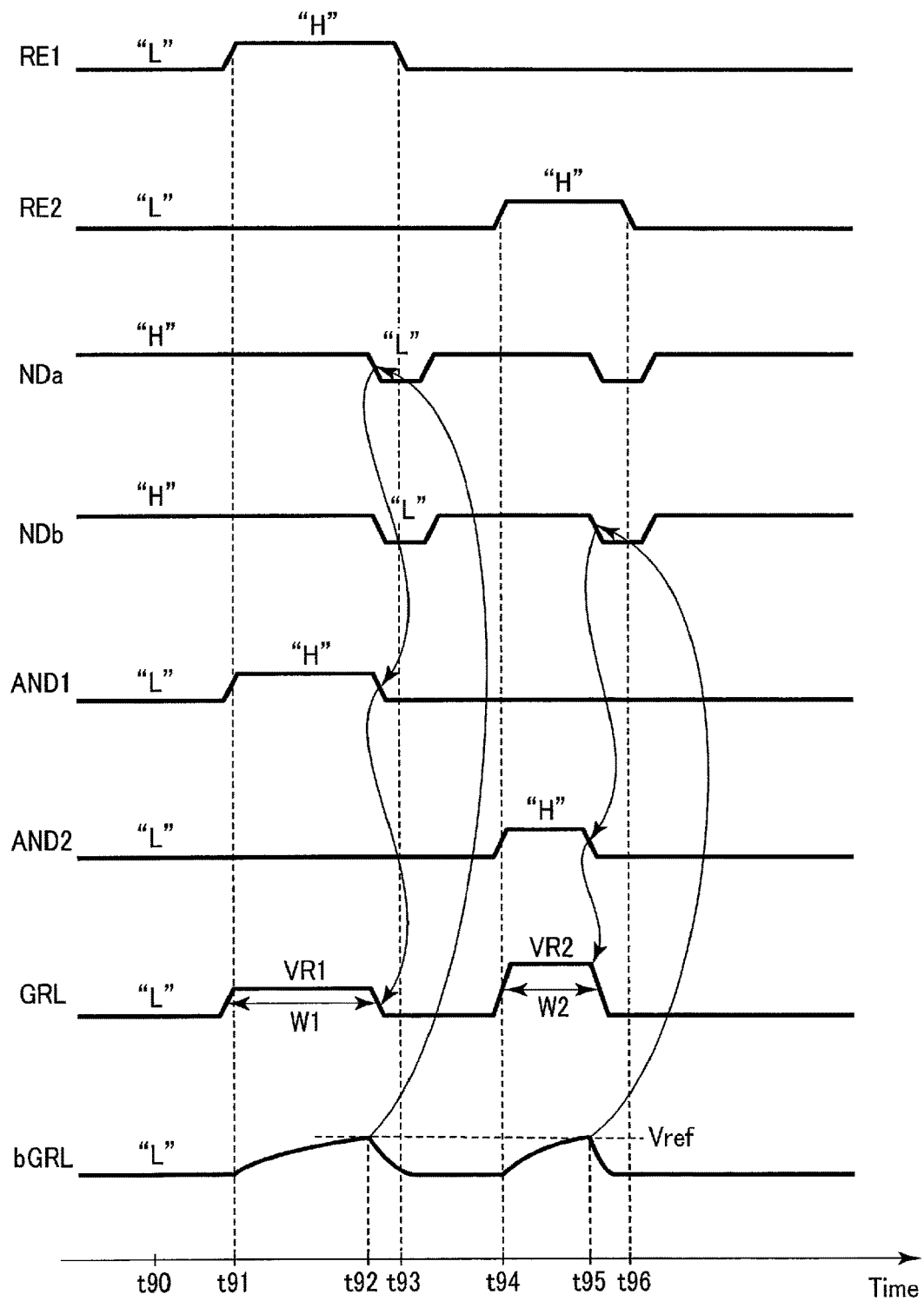
F I G. 14

F.I.G. 15

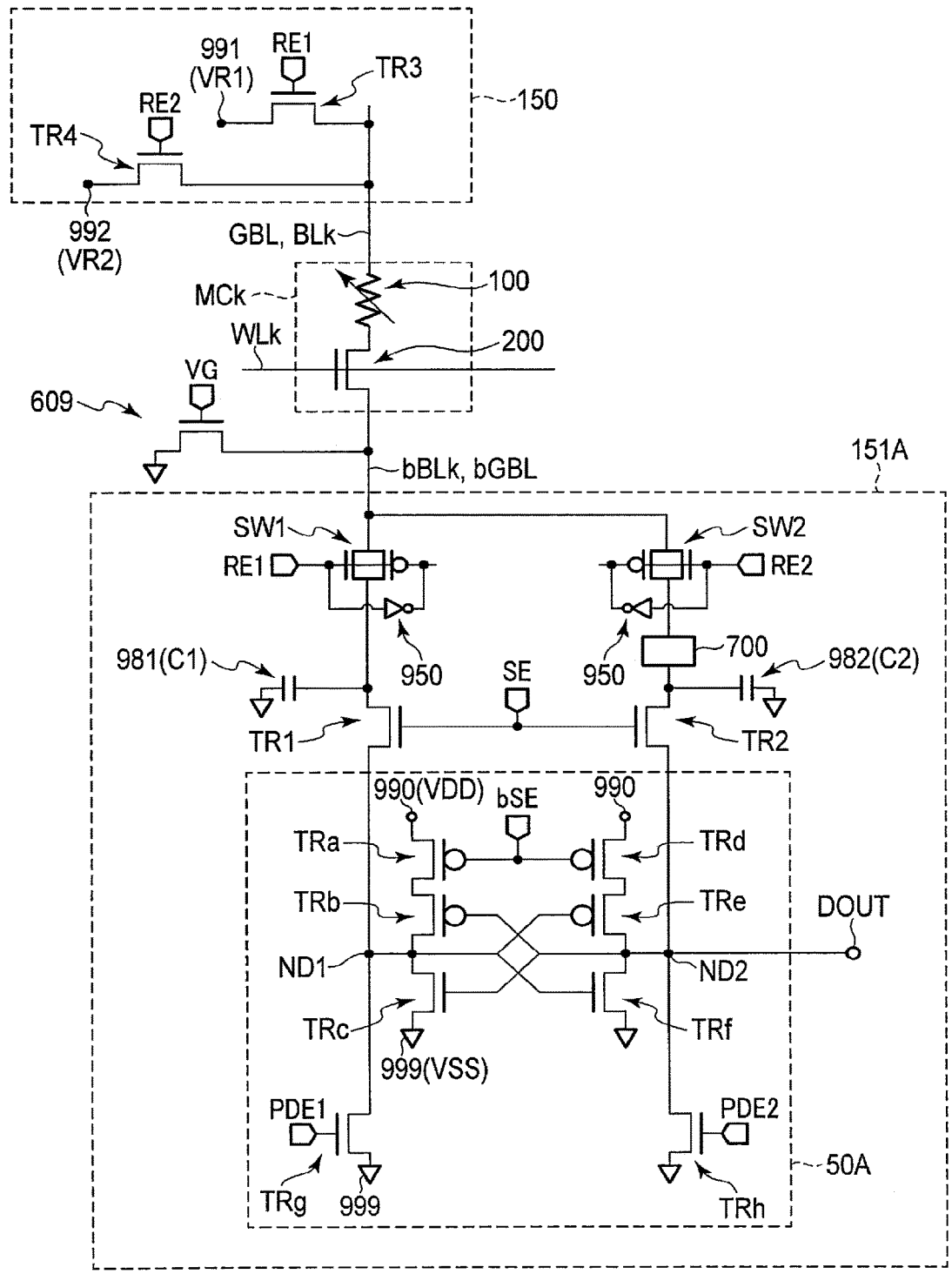
F I G. 16

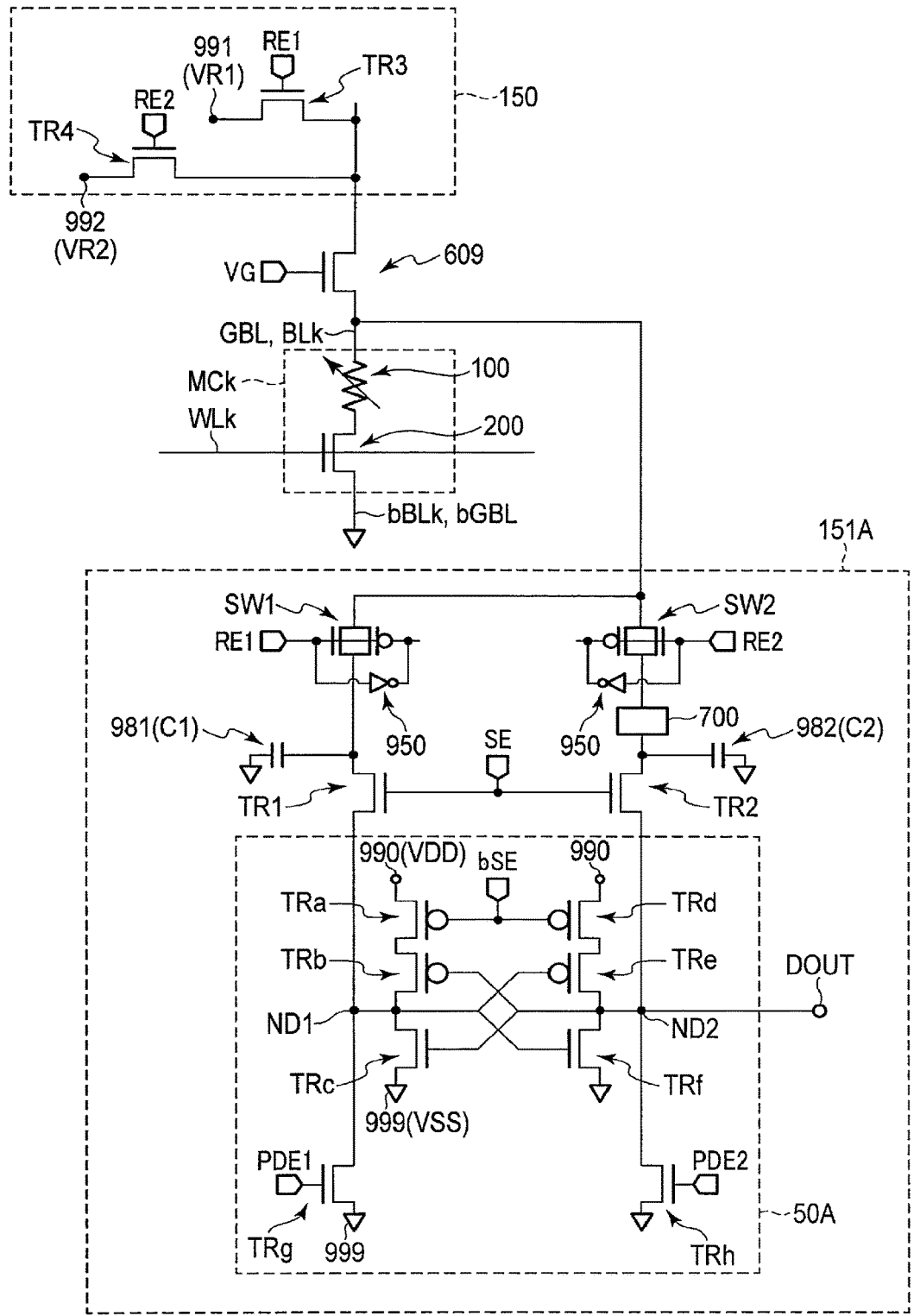
F I G. 17

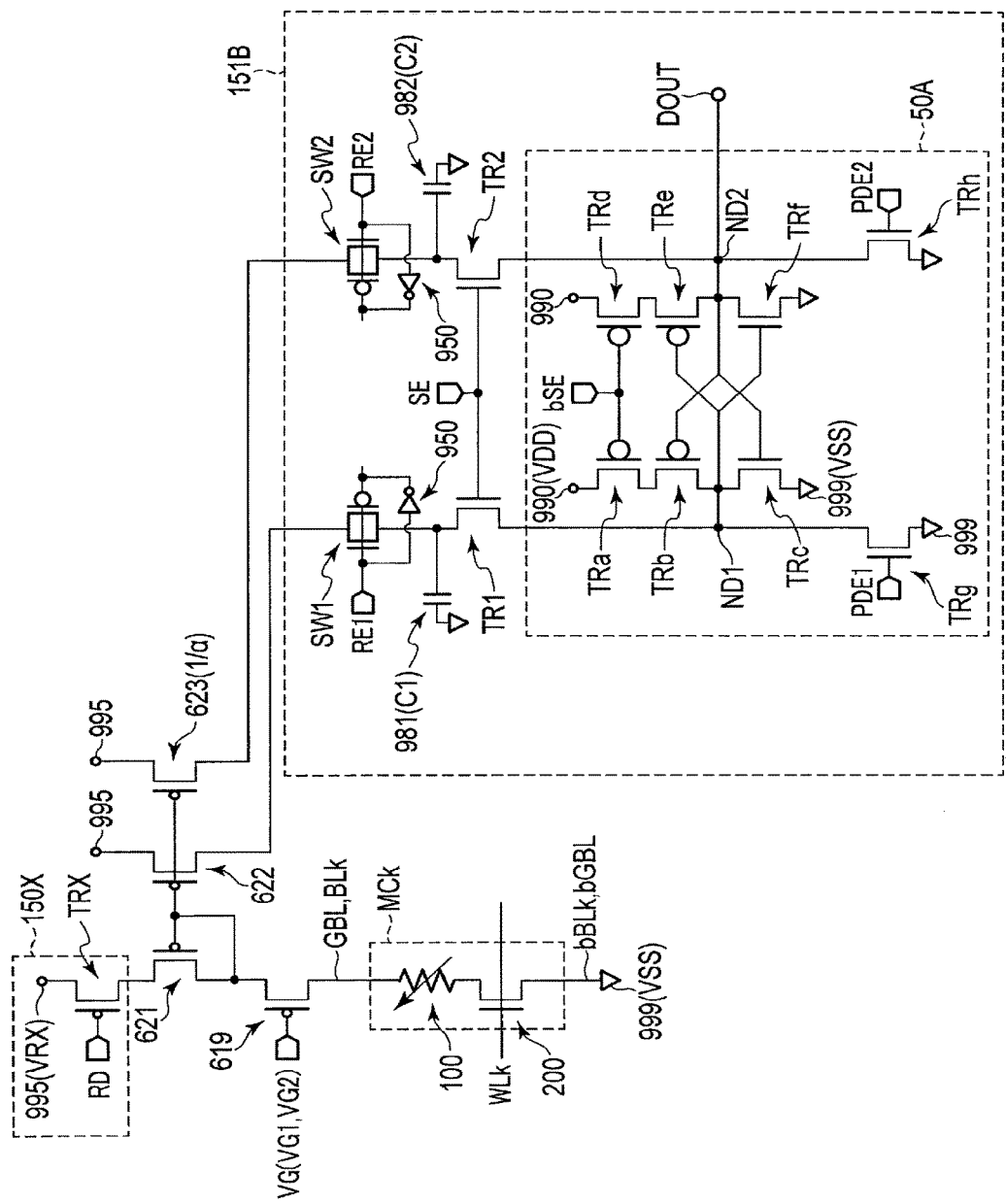
F I G. 19

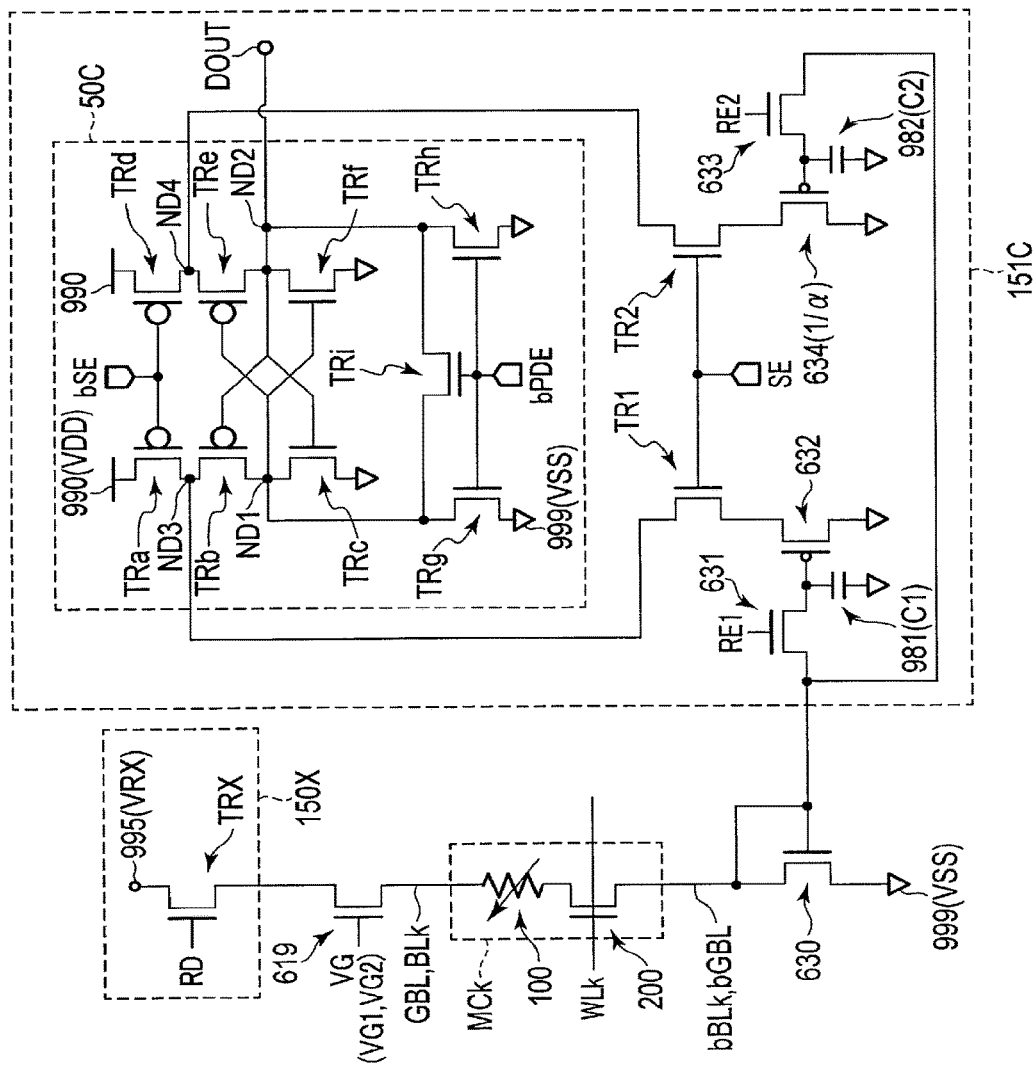
F I G. 20

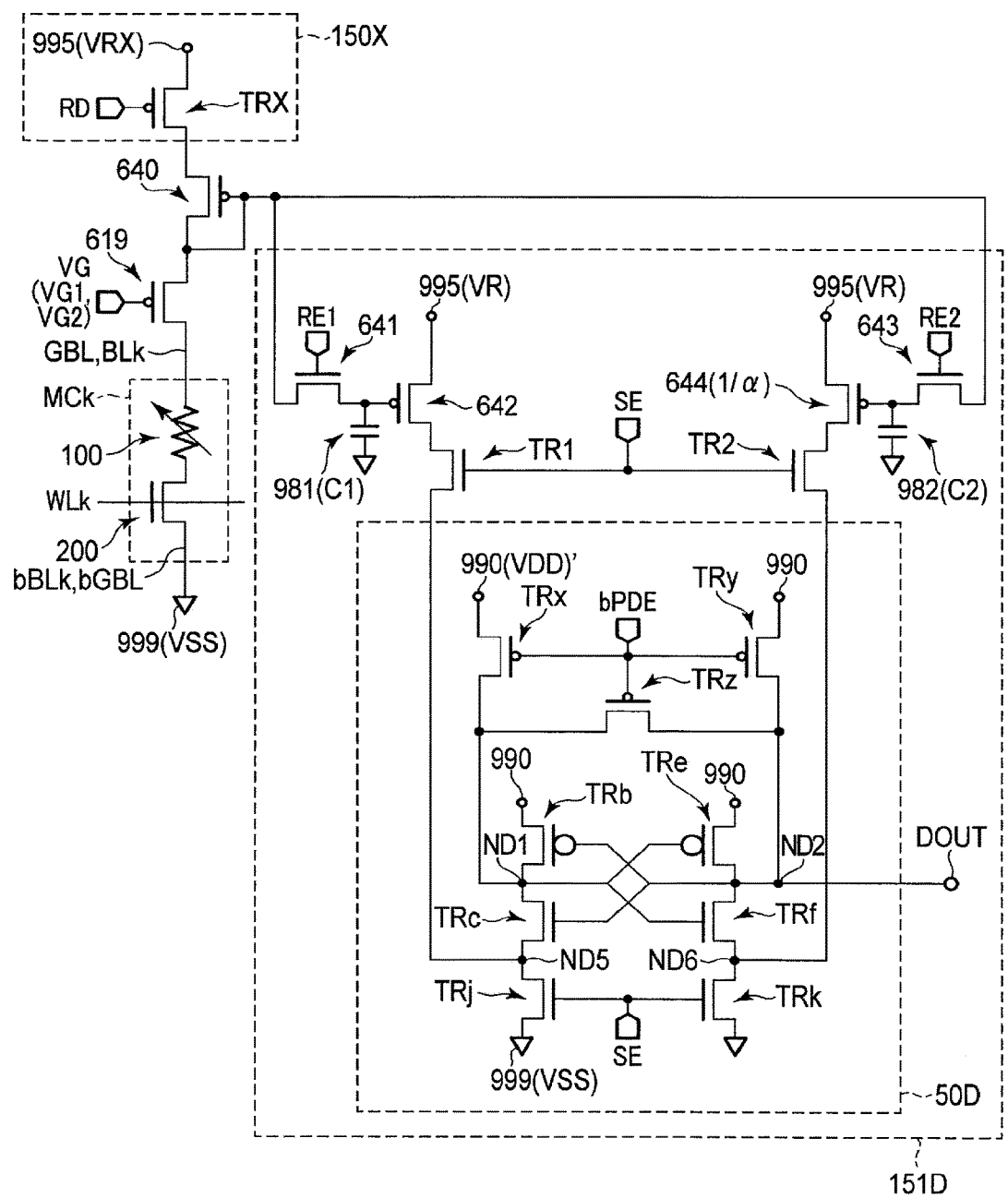
F I G. 21

MAGNETIC MEMORY AND MEMORY SYSTEM

CROSS-REFERENCE TO RELATED APPLICATIONS

This application is based upon and claims the benefit of priority from Japanese Patent Application No. 2016-226364, filed Nov. 21, 2016, the entire contents of which are incorporated herein by reference.

FIELD

Embodiments described herein relate generally to a magnetic memory and a memory system.

BACKGROUND

As an alternative memory for volatile memories such as SRAM and DRAM, nonvolatile memories such as spin transfer-torque (STT)-MRAM have drawn attention.

Research and development of various operations such as data writing and data reading are promoted to improve the characteristics and functions of the nonvolatile memory.

BRIEF DESCRIPTION OF THE DRAWINGS

FIG. 1 is a diagram for explaining a configuration example of a magnetic memory of an embodiment;

FIG. 2 is an equivalent circuit diagram showing a configuration example of a memory cell array of the magnetic memory of the embodiment;

FIG. 3 is a schematic cross-sectional view showing a structural example of a memory cell of the magnetic memory of the embodiment;

FIGS. 4A and 4B are diagrams for explaining operation of the magnetic memory of the embodiment;

FIG. 8 is an equivalent circuit diagram showing a configuration example of a read circuit of the magnetic memory of the embodiment;

FIG. 12 is a schematic diagram showing a configuration example of a magnetic memory of a third embodiment;

FIG. 13 is an equivalent circuit diagram showing the configuration example of the magnetic memory of the third embodiment;

FIG. 14 is a timing chart showing an operation example of the magnetic memory of the third embodiment;

FIG. 16, FIG. 17, FIG. 18 and FIG. 19 are equivalent circuit diagrams showing a configuration example of a magnetic memory of a fourth embodiment; and FIG. 20 and FIG. 21 are equivalent circuit diagrams showing a configuration example of a magnetic memory of a fifth embodiment.

DETAILED DESCRIPTION

Figure 5:
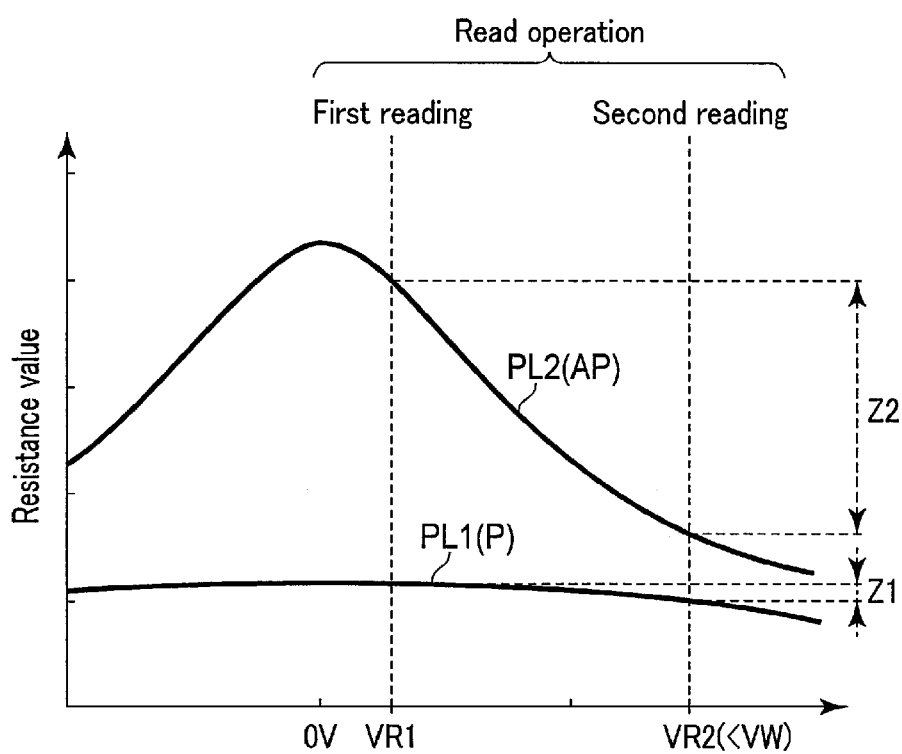
FIGS. 5 and 6 are diagrams for explaining the operation of the magnetic memory of the embodiment.

In general, according to one embodiment, a magnetic memory includes: a first magnetoresistive effect element having a first resistance state or a second resistance state; and a read circuit configured to apply a first read voltage to the first magnetoresistive effect element, hold a first charging potential caused by the first read voltage, apply a second read voltage higher than the first read voltage to the first magnetoresistive effect element, hold a second charging potential caused by the second read voltage, and determine whether the first magnetoresistive effect element is in the first resistance state or the second resistance state based on a comparison result between the first charging potential and the second charging potential.

Embodiment

Hereinafter, the present embodiments will be described in detail with reference to FIGS. 1 to 21. In the following explanation, the same reference numerals denote constituent elements having the same functions and configurations. In the following embodiments, when elements (such as word lines WL, bit lines BL, and various voltages and signals) having numerals/letters added at ends of reference numerals for differentiation are not distinguished from each other, an expression in which the last number/letter is omitted is used.

(1) First Embodiment

A memory device (e.g., a resistance change type memory such as a magnetic memory) of the first embodiment will be described with reference to FIGS. 1 to 9.

(a) Configuration

A configuration example of the memory device of the embodiment will be described with reference to FIGS. 1 to 4.

FIG. 1 is a block diagram for explaining the configuration example of the memory device of the first embodiment.

As shown in FIG. 1, a memory device 1 is directly or indirectly connected to a memory controller 5. The memory device 1 and the memory controller 5 are included in a memory system.

The memory controller 5 can control operation of the memory device 1. The memory controller 5 includes a CPU, a buffer memory, a work memory, an ECC circuit, and the like.

The memory controller 5 generates a command based on a request from a host device (not shown). The memory controller 5 transmits the generated command to the resistance change type memory 1.

The memory controller 5 transmits an address of a memory cell to be selected to the memory device 1 based on a management table in the work memory.

When writing data to the memory device 1, the memory controller 5 adds parity to the data to be written by the ECC circuit. The memory controller 5 transmits parity-added data DT to the resistance change type memory 1 via the buffer memory.

When reading data from the memory device 1, the memory controller 5 receives the data DT read from the memory device 1 via the buffer memory. The memory controller 5 detects an error in data by ECC processing executed on read data and corrects the detected error. The memory controller 5 transmits the ECC-processed data to the host device.

The memory device 1 at least includes a memory cell array 10, a command-address latch circuit 11, an input/output circuit 12, a row decoder 13A, a word line control circuit 13B, a column decoder 14A, a bit line control circuit 14B, a read circuit 15, a write circuit 16, a voltage generation circuit 17, and a control circuit 18.

The memory cell array 10 includes a plurality of memory cells MC.

When the memory device 1 is a resistance change type memory, the memory cell MC includes at least one variable resistance element 100. In the resistance change type memory 1, a plurality of resistance values (resistance states) that can be taken by the variable resistance element 100 are associated with data to be stored, whereby the resistance change type memory 1 stores one or more bits of data.

The command-address latch circuit 11 temporarily holds a command. CMD and an address ADR transmitted from the memory controller 5. The command-address latch circuit 11 transmits the command CMD to the control circuit 18. The command-address latch circuit 11 transmits the address ADR to the row decoder 13A and the column decoder 14A.

The input/output circuit (I/O circuit) 12 temporarily holds data (write data) DIN transmitted from the memory controller 5. The input/output circuit 12 temporarily holds data DOUT read from the memory cell array 10.

The row decoder 13A decodes a row address included in the address ADR.

The word line control circuit 13B selects a row (for example, a word line) of the memory cell array 10 based on the decode result of the row address.

The column decoder 14A decodes a column address included in the address ADR.

The bit line control circuit 14B selects a column (for example, a bit line) of the memory cell array based on the decode result of the column address.

During read operation, the read circuit 15 supplies various voltages or currents for data reading to the memory cell selected based on the address ADR. Consequently, data stored in the memory cell is read. The read circuit 15 at least includes a read driver and a sense amplifier circuit.

During write operation, the write circuit 16 supplies various voltages and currents for data writing to the memory cell selected based on the address ADR. Consequently, data to be written is written in the memory cell MC. The write circuit 16 at least includes a write driver.

The voltage generation circuit 17 generates various voltages used for the operation of the memory device 1 by using the voltage supplied from the outside of the memory device 1. The voltage generation circuit 17 supplies the generated voltage to each of the circuits 11 to 16.

The control circuit 18 receives a control signal CNT from the memory controller 5. The control circuit 18 transmits the control signal CNT to the memory controller 5 according to the operation state in the memory device 1. The control circuit 18 receives the command CMD from the memory controller 5 via the command-address latch circuit 11. The control circuit 18 controls the operation of each of the circuits 11 to 16 in the memory device 1 based on the command CMD and the control signal CNT.

For example, the control circuit 18 holds, as setting information, information on voltages and currents used for write operation, read operation and the like. For example, the control circuit 18 holds information on the voltage value and pulse width of the voltage used for the read operation.

The configuration of the memory system including the memory device 1 is not limited to the example shown in FIG. 1. The memory device 1 of this embodiment can be applied to various memory systems. For example, the memory controller 5 may not be provided for the memory device 1 in some cases. In this case, a command or the like is directly transmitted from the host device (for example, CPU) to the memory device 1. The memory device 1 may be provided in the CPU. The memory device 1 may be applied to the work memory or the buffer memory in the memory controller 5 (or the CPU) in some cases. The ECC circuit may be provided in the memory device 1.

FIG. 2 is a diagram showing an internal configuration of the memory cell array of the resistance change type memory according to the embodiment and an example of a circuit in the vicinity of the memory cell array.

As shown in FIG. 2, a plurality (n) of word lines WL (WL <0>, WL <1>, WL <n−1>) are provided in the memory cell array 10. A plurality (m) of bit lines BL (BL <0>, BL <1>, BL <m−1>) and a plurality (m) of bit lines bBL (bBL <0>, bBL <1>, bBL <m−1>) are provided in the memory cell array 10. The bit line BL and the bit line bBL form a pair of bit lines.

The memory cells MC are arranged in a matrix form in the memory cell array 10.

The memory cells MC aligned in the x direction (row direction) are connected to a common word line WL. The word line WL is connected to the word line control circuit 13B. The word line control circuit 13B controls the potential of the word line WL based on the row address. Consequently, the word line WL (row) indicated by the row address is selected and activated.

The memory cells MC aligned in the y direction (column direction) are commonly connected to the two bit lines BL and bBL belonging to a bit line pair.

In FIG. 2, for example, the memory cell array 10 has a structure of a hierarchical bit line system. In this case, global bit lines GBL and bGBL are provided in the memory cell array 10.

The global bit line GBL is connected to the bit line BL via a switch element M1 (M1 <0>, M1 <1>, . . . , M1 <m−1>). The global bit line bGBL is connected to the bit line bBL via a switch element M2 (M2 <0>, M2 <1>, . . . , M2 <m−1>). In the following description, in order to distinguish the explanation, the bit lines BL and bBL are also referred to as local bit lines BL and bBL.

A corresponding control signal CSL (CSL <0>, CSL <1>, . . . , CSL <m−1>) is supplied as a column selection signal to the gate of each of the transistors M1 and M2.

When the transistors M1 and M2 are set to ON states, the bit lines BL and bBL are electrically connected to the global bit lines GBL and bGBL. Consequently, the bit lines BL and bBL (columns) indicated by the column address are selected and activated.

The switch elements M1 and M2 are, for example, N type field effect transistors. The switch elements M1 and M2 may be treated as constituent elements of the bit line control circuit 14B.

In the following description, a memory cell selected as a memory cell to be operated based on the address ADR from outside is referred to as a selected cell.

For example, a read driver 150 of the read circuit 15 and a write driver (driver/sinker) 160 of the write circuit 16 are connected to the global bit line GBL. A write driver 161 and a sense amplifier circuit 151 of the read circuit 15 are connected to the global bit line bGBL.

The operations (activation) of the write drivers 160 and 161 are controlled by a control signal WE and its inverted signal. The operations (activation) of the read driver 150 and the sense amplifier circuit 151 are controlled by control signals RE1, RE2, and SE and their inverted signals, respectively.

The drivers 150, 160, and 161 and the sense amplifier circuit 151 may be connected to the local bit lines BL and bBL. Switch elements configured to set the local bit lines BL and bBL and the global bit lines GBL and bGBL to discharged states may be provided in the local bit lines BL and bBL and the global bit lines GBL and bGBL.

The memory cell MC includes the variable resistance element 100 and a cell transistor 200. The variable resistance element 100 functions as a memory element. The cell transistor 200 functions as a selection element of the memory cell MC.

One end of the variable resistance element 100 is connected to the bit line BL. The other end of the variable resistance element 100 is connected to one end (one of the source/drain) of the cell transistor 200. The other end (the other of the source/drain) of the cell transistor 200 is connected to the bit line bBL.

The memory cell MC stores one or more bits of data by associating the resistance state (resistance value) of the variable resistance element 100 with the data.

For example, the resistance change type memory of this embodiment is an MRAM. In the MRAM, a magnetoresistive effect element is used as a variable resistance element as a memory element.

The memory cell MC including the magnetoresistive effect element has the following structure.

<Example of Structure of Memory Cell>

FIG. 3 is a cross-sectional view showing a structural example of the memory cell of the resistance change type memory of this embodiment.

As shown in FIG. 3, the memory cell MC is provided on a semiconductor substrate 290. In FIG. 3, for simplicity of illustration, illustration of an interlayer insulating film on the semiconductor substrate 290 and an element isolation insulating film in the semiconductor substrate 290 is omitted.

The cell transistor 200 is any type of transistor. For example, the cell transistor 200 is a field effect transistor having a planar structure, a field effect transistor having a three-dimensional structure such as FinFET, or a field effect transistor having a buried gate structure. In the following description, a cell transistor having a planar structure is exemplified.

The cell transistor 200 is provided in an active region (semiconductor region) AA on the semiconductor substrate 290.

In the cell transistor 200, a gate electrode 210 is provided above the active region AA via a gate insulating film 220. The gate electrode 210 extends in the depth direction (or the front direction) in FIG. 3. The gate electrode 210 functions as the word line WL.

Source/drain regions 230A and 230B of the cell transistor 200 are provided in the active region AA.

A contact plug P1A is provided on the source/drain region 230A. An interconnect (metal film) 90A as the bit line bBL is provided on the contact plug P1A.

A contact plug P1B is provided on the source/drain region 230B.

The magnetoresistive effect element 100 is provided on a metal film 90B on the contact plug P1B. The magnetoresistive effect element 100 is provided in an interlayer insulating film (not shown).

The magnetoresistive effect element 100 at least includes two magnetic layers 110 and 120, a nonmagnetic layer 130, an upper electrode 180, and a lower electrode 190.

The nonmagnetic layer 130 is provided between the two magnetic layers 110 and 120.

The magnetic layer 110 is provided between the upper electrode 180 and the nonmagnetic layer 130. The magnetic layer 120 is provided between the nonmagnetic layer 130 and the lower electrode 190. The lower electrode 190 is provided on the metal film 90B. An interconnect (metal film) 95 as the bit line BL is provided above the upper electrode 180 via a via plug P2.

In this embodiment, the magnetoresistive effect element 100 has a magnetic tunnel junction. The magnetic tunnel junction is formed of the two magnetic layers 110 and 120 and the nonmagnetic layer 130. Hereinafter, the magnetoresistive effect element 100 having a magnetic tunnel connection is referred to as an MTJ element.

In the MTJ element 100, the nonmagnetic layer 130 is referred to as the tunnel barrier layer 130. The tunnel barrier layer 130 is, for example, an insulating film including magnesium oxide (MgO).

The two magnetic layers 110 and 120 have localized magnetization. The magnetic layer 110 is a magnetic layer whose magnetization direction is variable. The magnetic layer 120 is a magnetic layer whose magnetization direction is invariable. Hereinafter, the magnetic layer 110 whose magnetization direction is variable is referred to as the storage layer 110, and the magnetic layer 120 whose magnetization direction is invariable is referred to as the reference layer 120. The storage layer 110 may be referred to as a free layer or a magnetization free layer in some cases. The reference layer 120 may be referred to as a pin layer, a pinned layer, a magnetization fixed layer, or a magnetization invariable layer in some cases.

When the magnetization direction of the reference layer 120 is "invariable" or "in a fixed state", it means that when a current or voltage for reversing the magnetization direction of the storage layer 110 is supplied to the MTJ element 100, the magnetization direction of the reference layer 120 does not change. A magnetization switching threshold value of the storage layer 110 and a magnetization switching threshold value of the reference layer 120 are respectively controlled such that the magnetization direction of the reference layer 120 is invariable.

The storage layer 110 is a magnetic layer having perpendicular magnetic anisotropy.

The perpendicular magnetic anisotropy is developed in the storage layer 110 by interface magnetic anisotropy between the tunnel barrier layer 130 and the storage layer 110. Consequently, the storage layer 110 has magnetization substantially perpendicular to an interface between the tunnel barrier layer 130 and the storage layer 110. The magnetization direction (easy magnetization axis direction) of the storage layer 110 is substantially parallel to a stacking direction of the two magnetic layers 110 and 120.

The storage layer 110 is a magnetic layer including at least two of cobalt (Co), iron (Fe), boron (B), and the like.

The reference layer 120 has perpendicular magnetic anisotropy due to interface magnetic anisotropy. The magnetization direction of the reference layer 120 is substantially parallel to the stacking direction of the two magnetic layers 110 and 120. The magnetization direction of the reference layer 120 is substantially perpendicular to a layer surface of the magnetic layer 120.

For example, the reference layer 120 includes an artificial lattice including at least cobalt (Co) and platinum (Pt). For example, the thickness of the reference layer 120 is greater than the thickness of the storage layer 110. Consequently, the magnetization switching threshold value of the reference layer 120 is higher than the magnetization switching threshold value of the storage layer 110.

A magnetic layer (hereinafter referred to as an interface layer) including at least two of Co, Fe, B and the like may be provided between the artificial lattice of the reference layer 120 and the tunnel barrier layer 130.

A shift cancel layer 125 is provided between the reference layer 120 and the lower electrode 190. The shift cancel layer 125 is a magnetic layer configured to reduce a stray magnetic field of the reference layer 120. The magnetization direction of the shift cancel layer 125 is opposite to the magnetization direction of the reference layer 120. Consequently, adverse effects (eg, magnetic field shift) on the magnetization of the storage layer 110 due to the stray magnetic field of the reference layer 120 are suppressed.

The magnetization direction of the reference layer 120 and the magnetization direction of the shift cancel layer 125 are set opposite to each other by a synthetic antiferromagnetic (SAF) structure.

In the SAF structure, an intermediate layer 129 is provided between the reference layer 120 and the shift cancel layer 125. The reference layer 120 and the shift cancel layer 125 are antiferromagnetically coupled by the intermediate layer 129.

The intermediate layer 129 is, for example, a nonmagnetic metal film such as ruthenium (Ru).

For example, when Ru is used for the intermediate layer 129, an antiferromagnetic coupling force in the reference layer 120 and the shift cancel layer 125 can be strengthened by adjusting the thickness of the intermediate layer 129. Consequently, the magnetization directions of the reference layer 120 and the shift cancel layer 125 are automatically stabilized in an antiparallel state.

The magnetization directions of the reference layer 120 and the shift cancel layer 125 may be antiparallel to each other, and are not limited to the directions shown in FIG. 3. A laminate (SAF structure) including the magnetic layers 120 and 125 and the intermediate layer 129 may be referred to as a reference layer in some cases.

The resistance state (resistance value) of the MTJ element 100 changes according to a relative relationship (magnetization alignment) between the magnetization direction of the storage layer 110 and the magnetization direction of the reference layer 120.

When the magnetization direction of the storage layer 110 is the same as the magnetization direction of the reference layer 120 (the magnetization alignment of the MTJ element 100 is in a parallel alignment state), the MTJ element 100 sets a first resistance value R1. When the magnetization direction of the storage layer 110 is different from the magnetization direction of the reference layer 120 (the magnetization alignment of the MTJ element 100 is in a magnetization antiparallel alignment state), the MTJ element 100 has a second resistance value R2 higher than the first resistance value R1.

In this embodiment, the parallel alignment state in the MTJ element 100 is also referred to as the P state, and the antiparallel alignment state in the MTJ element 100 is also referred to as the AP state.

For example, when the memory cell MC stores 1 bit of data ("0" data or "1" data), first data (for example, "0" data) is associated with the MTJ element 100 in a state (first resistance state) having the first resistance value R1. Second data (for example, "1" data) is associated with the MTJ element 100 in a state (second resistance state) having the second resistance value R2.

In this manner, the MTJ element (perpendicular magnetization type MTJ element) 100 using a perpendicular magnetization film is used for the memory element.

The MTJ element 100 may be an MTJ element (parallel magnetization type MTJ element) in which the magnetizations of the storage layer and the reference layer are oriented in a direction perpendicular to the stacking direction of the magnetic layers. In the parallel magnetization type MTJ element, the easy magnetization axis directions of the storage layer and the reference layer are parallel to the layer surface of the magnetic layer.

(b) Operation Example (b-1) Operation Principle of MRAM

Operation of the MRAM of this embodiment will be described with reference to FIGS. 4A and 4B.

FIGS. 4A and 4B are schematic diagrams for explaining write operation and read operation of the MRAM of this embodiment. In FIGS. 4A and 4B, illustration of the shift cancel layer 125 and the intermediate layer 129 is omitted for the sake of simplicity of illustration and explanation.

Either of the following two methods may be used for the write operation of the MRAM.

In FIG. 4A, STT (Spin Transfer Torque) is applied to the write operation of the MRAM. The write operation using the STT is a write method that causes switching of the magnetization of the storage layer 110 by applying a spin torque of electrons included in a write current to the magnetization of the storage layer 110 of the MTJ element 100. In this embodiment, the MRAM in which the STT is used for data writing is referred to as STT-MRAM.

In data writing using the STT, a spin torque of electrons of a write current IW (IW1, IW2) is applied to the magnetization of the storage layer 110. Consequently, the magnetization direction of the storage layer 110 is aligned in the same direction as the spin of electrons which apply the spin torque.

Depending on whether the magnetization direction of the storage layer 110 is set to be parallel to (the same as) the magnetization direction of the reference layer 120 or set to be antiparallel (opposite) thereto, the direction of the write current IW supplied to the MTJ element 100 is controlled.

When the magnetization direction of the storage layer 110 is set to be opposite to the magnetization direction of the reference layer 120 (the magnetization state of the MTJ element is changed from the parallel alignment state to the antiparallel alignment state), the write current IW1 flowing from the reference layer 120 to the storage layer 110 is supplied to the MTJ element 100. In this case, electrons having a spin in a direction opposite to the magnetization direction of the reference layer 120 are reflected by the tunnel barrier layer 130. A spin torque is applied to the magnetization of the storage layer 110 by the electrons reflected by the tunnel barrier layer 130.

Consequently, the magnetization of the storage layer 110 becomes opposite to the magnetization direction of the reference layer 120.

When the magnetization direction of the storage layer 110 is set to be the same as the magnetization direction of the reference layer 120 (the magnetization alignment of the MTJ element is changed from the antiparallel alignment state to the parallel alignment state), the write current IW2 flowing from the storage layer 110 to the reference layer 120 is supplied to the MTJ element 100. In this case, electrons having a spin in the same direction as the magnetization direction of the reference layer 120 pass through the tunnel barrier layer 130. A spin torque is applied to the magnetization of the storage layer 110 by the electrons passing through the tunnel barrier layer 130.

Consequently, the magnetization of the storage layer 110 is aligned with the magnetization direction of the reference layer 120.

In this manner, in the STT-MRAM, the polarity (direction of current flow) of the write current IW flowing in the MTJ element 100 differs according to the data written in the MTJ element 100.

In FIG. 4B, writing of data to the MTJ element 100 is executed based on a principle different from that for writing of data using the STT.

In data writing in FIG. 4B, a voltage effect in the MTJ element 100 is utilized. In write operation using the voltage effect, the magnetization alignment of the MTJ element is set to the antiparallel alignment state or the parallel alignment state by application of a write voltage VW to the MTJ element 100. In the following description, a method (write operation) of writing data to the MTJ element 100 using the voltage effect is referred to as voltage writing. In this embodiment, the MRAM in which the voltage effect is used for data writing is referred to as a voltage write type MRAM (or a voltage torque type MRAM).

In the example of FIG. 4B, the write voltage VW is applied to the bit line bBL, and a certain voltage smaller than the voltage VW is applied to the bit line BL. Due to a potential difference between the two bit lines BL and bBL, the current IW1 flows into the MTJ element 100.

In the voltage effect, the write voltage VW with a certain pulse width and a certain voltage value is applied to the MTJ element 100, and an effective magnetic field applied to the MTJ element 100 is reduced. For example, the voltage value of the write voltage VW is set such that the effective magnetic field becomes zero.

This causes a precession motion of the magnetization of the storage layer 110 to be excited. Consequently, the magnetization of the storage layer 110 is switched.

Supply of the write voltage VW is stopped at a timing when the magnetization direction of the storage layer 110 changes from the direction in an initial state to its opposite direction. As a result, the precession motion of the storage layer 110 ceases, and the magnetization direction of the storage layer 110 is set opposite to the initial state.

The pulse width of the write voltage VW is set such that the precession motion of the magnetization of the storage layer 110 ceases at the timing when the magnetization direction of the storage layer 110 changes from the direction in the initial state to its opposite direction. For example, in order to switch the magnetization of the storage layer 110, the pulse width of the write voltage VW is set in the range of about from 0.5 nanoseconds to 1.0 nanoseconds.

In the voltage write type MRAM, data to be written does not depend on a polarity of a voltage applied to the MTJ element 100. The magnetic properties of the magnetic layers 110 and 120 are designed such that a switching threshold value of the reference layer 120 with respect to a voltage value is higher than a switching threshold value of the storage layer 110 with respect to a voltage value. Thus, even if the write voltage VW is applied to the MTJ element 100, the magnetization of the reference layer 120 is not switched.

In this manner, the magnetization state of the MTJ element 100 is controlled using the STT or the voltage effect.

Consequently, data is written in the memory cell MC. Even when any of the write operations is used in the MRAM of this embodiment, the same result can be obtained.

Even when the write operation in the MRAM is the STT method or the voltage write method, the read operation in the MRAM is executed by substantially the same operation.

In the read operation in the MRMA, a read voltage VR is applied to the memory cell MC. Upon application of the read voltage VR, a read current IR flows into the MTJ element 100. The read voltage VR is, for example, smaller than the write voltage VW. For example, the read current IR is smaller than the write currents IW1 and IW2. For example, a direction in which the read current IR flows is set to a direction from the storage layer 110 to the reference layer 120.

Depending on the resistance state of the MTJ element 100, a charging potential of a bit line due to the supply of the read current IR, the potential of a certain node of the memory cell MC due to the application of the read voltage VR, or the magnitude of the read current IR from the memory cell MC varies.

The data stored in the memory cell MC is discriminated by comparing the potential or the current value due to the application of the read voltage VR to the memory cell MC with a certain reference value.

In the read operation of the MRAM of this embodiment, a reference value for data reading (discriminating the resistance state of the MTJ element) is set using the selected cell at the time of the read operation.

As described above, reading of data for setting a reference value for data reading using the selected cell itself is referred to as a self-reference method. The MRAM of this embodiment executes the read operation using the self-reference method.

As described below, in the MRAM of this embodiment, two read voltages VR1 and VR2 having different pulse shapes are continuously applied to the memory cell MC including the MTJ element 100 for the read operation by the self-reference method.

Hereinafter, the read operation of the MRAM of this embodiment will be described in more detail.

(b-2) Principle of Read Operation of MRAM of Present Embodiment

The principle of the read operation of the MRAM of this embodiment will be described with reference to FIGS. 5 and 6.

FIG. 5 is a graph showing a voltage dependence of the resistance value of the magnetoresistive effect element (MTJ element).

In FIG. 5, the horizontal axis of the graph corresponds to a voltage applied to the MTJ element, and the vertical axis of the graph corresponds to the resistance value of the MTJ element. In FIG. 5, a characteristic PL1 of the MTJ element in the parallel alignment state (P state) and a characteristic PL2 of the MTJ element in the magnetization antiparallel alignment state (AP state) are shown.

As shown in FIG. 5, as the tendency of a relationship between the resistance value of the MTJ element and the applied voltage, as the applied voltage increases, the resistance value of the MTJ element 100 decreases. If a write voltage (write current) or breakdown voltage is not applied to the MTJ element, the magnetization alignment of the MTJ element is maintained even if the resistance value of the MTJ element decreases due to an increase of the applied voltage.

The voltage dependent characteristic PL1 of the resistance value of the MTJ element in the P state is different from the voltage dependent characteristic PL2 of the resistance value of the MTJ element in the AP state.

As shown by the characteristic PL1, even if the applied voltage increases from the voltage value VR1 to the voltage value VR2, a change amount (decrease amount) Z1 of the resistance value of the MTJ element in the P state is small.

On the other hand, as shown by the characteristic PL2, in the range of the applied voltage from the voltage value VR1 to the voltage value VR2, a change amount Z2 of the resistance value of the MTJ element in the AP state is larger than the change amount Z1 of the resistance value of the MTJ element in the P state.

For example, when the voltage VR2 is applied to the MTJ element, the resistance value of the MTJ element in the AP state has a value close to the resistance value of the MTJ element in the P state.

In this manner, the resistance value of the MTJ element in the case where a certain voltage is applied to the MTJ element and the change amounts Z1 and Z2 of the resistance value of the MTJ element to the applied voltage are different according to the magnetization alignment state of the MTJ element.

In the MRAM 1 of this embodiment, by utilizing the difference between the change amounts Z1 and Z2 of the resistance value of the MTJ element due to the voltage dependence, data corresponding to a resistance state of the MTJ element 100 is discriminated from two values obtained from selected cell with different voltage application states.

The MRAM of this embodiment uses the voltage dependence of the resistance value of the MTJ element as described above to execute the read operation by the self-reference method without destroying the data of the MTJ element.

Figure 6:
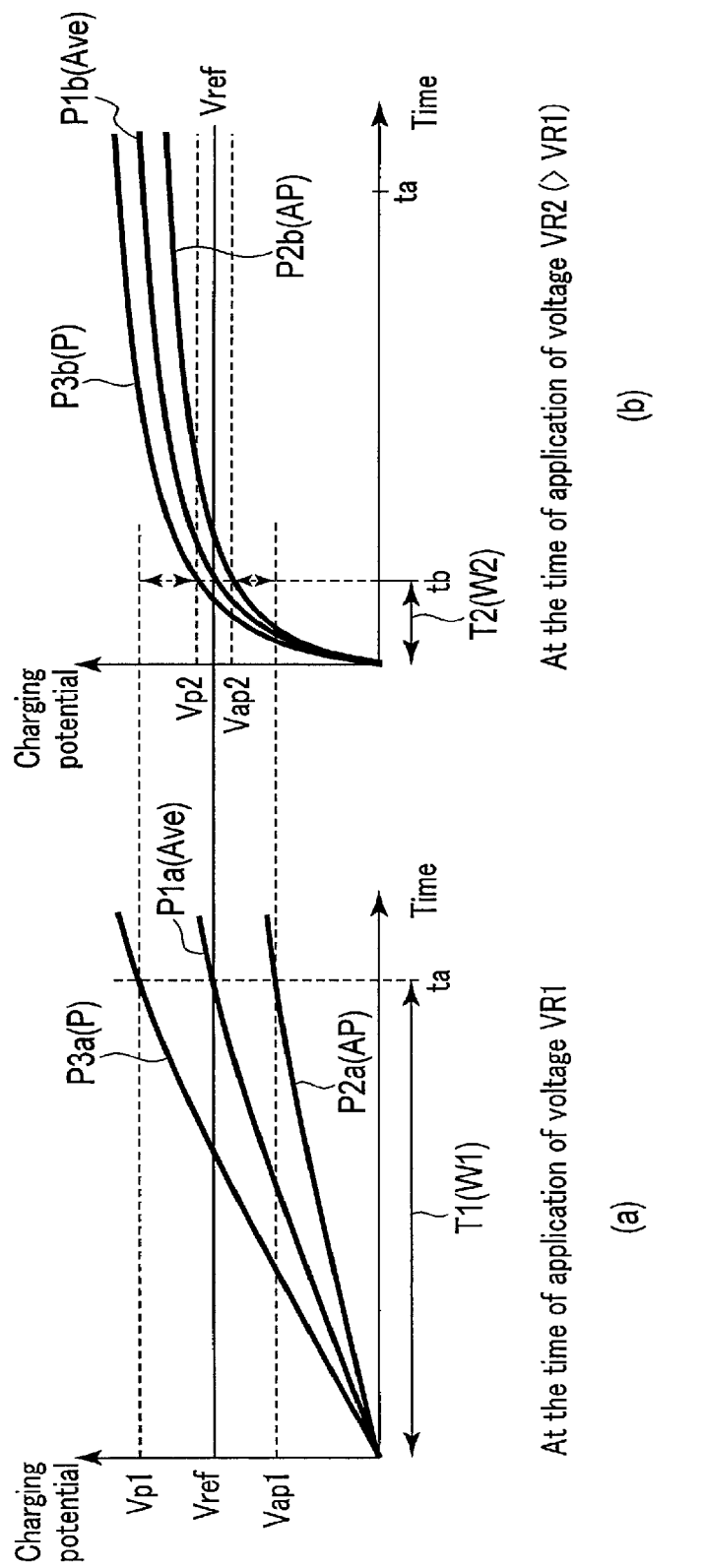

FIG. 6 is a diagram for explaining read operation in the MRAM of this embodiment.

(a) of FIG. 6 is a schematic diagram showing a relationship between a charging potential of a certain node (interconnect) and time due to an output current from the MTJ element at the time of the application of the voltage VR1. In (a) of FIG. 6, the horizontal axis of the graph corresponds to time, and the vertical axis of the graph corresponds to the charging potential.

(b) of FIG. 6 is a schematic diagram showing the relationship between the charging potential of a certain node (interconnect) and the time due to the output current from the MTJ element at the time of the application of the voltage VR2 (VR2>VR1). In (b) of FIG. 6, the horizontal axis of the graph corresponds to time, and the vertical axis of the graph corresponds to the charging potential.

In each of (a) and (b) of FIG. 6, characteristic lines P2a and P2b indicating a relationship between the time and the charging potential in the MTJ element in the AP state and characteristic lines P3a and P3b indicating a relationship between the time and the charging potential in the MTJ element in the P state are shown.

In (a) and (b) of FIG. 6, the characteristic lines P1a and P1b indicate a relationship between the time and a charging voltage in the MTJ element having a resistance value between the resistance value of the MTJ element in the P state and the resistance value of the MTJ element in the AP state. The characteristic lines P1a and P1b correspond to a change of the charging potential between the charging potential of the MTJ element in the P state and the charging potential of the MTJ element in the AP state.

As shown in (a) of FIG. 6, in a period (charging period) T1 from a start of the application of the voltage VR1 to time ta, a certain node is charged by the output current (read current of the memory cell) of the MTJ element.

Thereby, at the time ta, the charging potential of a certain node reaches certain potentials Vap1 and Vp1 according to the resistance state of the MTJ element.

As indicated by the characteristic line P2a, with respect to the MTJ element in the AP state, a certain node is charged to the potential Vap1 at the time ta.

As indicated by the characteristic line P3a, with respect to the MTJ element in the P state, a certain node is charged to the potential Vp1 at the time ta.

As described with reference to FIG. 5, when the voltage VR1 is applied, the resistance value of the MTJ element in the P state is smaller than the resistance value of the MTJ element in the AP state. Thus, in the period T1, the amount of a current (charge amount) output from the MTJ element in the P state is larger than the amount of a current output from the MTJ element in the AP state.

Thus, at the time ta, the charging potential Vp1 of a node connected to the MTJ element in the P state is higher than the charging potential Vap1 of a node connected to the MTJ element in the AP state.

As indicated by the characteristic line P1a, in the MTJ element having the resistance value between the resistance value of the MTJ element in the P state and the resistance value of the MTJ element in the AP state, the potential at the time to is a potential Vref. The potential Vref is a value between a charging potential Vp1 and a charging potential Vap1.

For example, the period T1 corresponds to a pulse width (read voltage application period) W1 of the read voltage VR1.

As shown in (b) of FIG. 6, a certain node is charged by the output current of the MTJ element (memory cell) to which the voltage VR2 (>VR1) is applied. In a relationship between the charging potential in the MTJ element in the P state and the charging potential in the MTJ element in the AP state, similarly to the example in (a) of FIG. 6, at each time in (b) of FIG. 6, the charging potential in the MTJ element in the P state is higher than the charging potential in the MTJ element in the AP state.

As described with reference to FIG. 5, since the resistance value of the MTJ element decreases as the voltage VR2 applied to the MTJ element increases, a current output from the memory cell increases. Thus, when the voltage VR2 higher than the voltage VR1 is applied to the memory cell including the MTJ element, the charging speed of a certain node at the time of the application of the voltage VR2 is higher than the charging speed of a node at the time of the application of the voltage VR1.

In a period T2 from a start of the application of the voltage VR2 to time tb, as indicated by the characteristic lines P2b and P3b in (b) of FIG. 6, a change in the charging potential of a node in the MTJ element at the time of the application of the voltage VR2 is steeper than a change in the charging potential of a node in the MTJ element at the time of the application of the voltage VR1.

When the voltage VR2 is applied to the MTJ element, a voltage value between the charging potential of a node relating to the MTJ element in the P state and the charging potential of a node relating to the MTJ element in the AP state reaches the voltage value Vref in the period T2 shorter than the period T1.

The voltage value Vref at the time tb at the time of the application of the voltage VR2 is the same value as the voltage value Vref at the time ta at the time of the application of the voltage VR1.

At the time tb, the charging potential of the node in the MTJ element in the P state has a voltage value Vp2 higher than the voltage value Vref. At the time tb, the charging potential of the node in the MTJ element in the AP state has a voltage value Vap2 lower than the voltage value Vref.

However, with respect to the MTJ element in the P state, the voltage value Vp2 at the time tb is lower than the voltage value Vp1 at the time ta.

Conversely, with respect to the MTJ element in the AP state, the voltage value Vap2 at the time tb is higher than the voltage value Vap1 at the time ta.

A magnitude relation between the charging potential at the time ta at the time of the application of the voltage VR1 and the charging potential at the time tb at the time of the application of the voltage VR2 is reversed between the MTJ element in the AP state and the MTJ element in the P state, and as described with reference to FIG. 5, this is because the amount of decrease in the resistance value of the MTJ element in the AP state is larger than the amount of decrease in the resistance value of the MTJ element in the P state due to the voltage dependence of the resistance value of the MTJ element.

In this way, in the MRAM of this embodiment, when the two different voltages VR1 and VR2 are used, the magnitude relation of the charging potential of this node at the times ta and tb at which a certain node reaches the common voltage value Vref is opposite between the MTJ element in the P state and the MTJ element in the AP state.

The MRAM of this embodiment uses the read voltages VR1 and VR2 set so as to enable comparison of the charging potential based on the voltage dependence of the resistance value of the MTJ element to compare the charging potential of a certain node at the time of the application of the read voltage VR1 with the charging potential of a certain node at the time of the application of the read voltage VR2.

The period T1 from the start of the application of the voltage VR1 to the time ta corresponds to the pulse width W1 of the read voltage VR1. The period T2 from the start of the application of the voltage VR2 to the time tb corresponds to a pulse width W2 of the read voltage VR2. The period T2 is shorter than the period until the charging potential due to output of the MTJ element 100 reaches a saturation state.

The first read period T1 (the pulse width W1 of the first read voltage VR1) may be the same as the second read period T2 (the pulse width W2 of the second read voltage VR2).

In the MRAM of this embodiment, in consideration of a period during which the charging potential of a node reaches a certain common potential, the pulse widths W1 and W2 of the voltages VR1 and VR2 are controlled such that, regarding the MTJ element in the P state, the charging potential of the node at the time of the application of the voltage VR2 is lower than the charging potential of the node at the time of the application of the voltage VR1, and regarding the MTJ element in the AP state, the charging potential of the node at the time of the application of the voltage VR2 is higher than the charging potential of the node at the time of the application of the voltage VR1.

Consequently, in the MRAM of this embodiment, even if the application of the read voltages VR1 and VR2 with different voltage values is executed to the selected cell in order to discriminate data in the selected cell, comparison of the two charging potentials relating to the MTJ element in the P state based on the application of the two read voltages VR1 and VR2 and comparison of the two charging potentials relating to the MTJ element in the AP state based on the application of the two read voltages VR1 and VR2 can be executed.

The voltage values and the pulse widths W1 and W2 of the read voltages VR1 and VR2 can be set based on an experimental result of the MRAM, a simulation result, and a test process of a chip of the MRAM. The results of the experiment and the test process are held, in a chip of the MRAM1, as setting information on the read voltage (and write voltage).

The voltage value of the read voltage VR2 is smaller than a voltage at which the MTJ element is dielectric breakdown. It is preferable that the voltage value of the read voltage VR2 is smaller than the write voltage VW.

If the pulse width of the read voltage is set such that regarding the MTJ element in the P state, the charging potential of the node at the time of the application of the voltage VR2 is lower than the charging potential of the node at the time of the application of the voltage VR1, and regarding the MTJ element in the AP state, the charging potential of the node at the time of the application of the voltage VR2 is higher than the charging potential of the node at the time of the application of the voltage VR1, the pulse width of the read voltage may be set based on a period different from the period during which the charging potential of a node reaches a certain common potential.

In the example of the read method shown in FIG. 6, the read voltages VR1 and VR2 are applied to the bit line BL to charge the potential of a certain node (interconnect). Such a read method can be said to be read operation by a charge accumulation method.

After the potential of a certain node (interconnect), for example, the bit line bBL, is discharged in advance, the bit line bBL is set to a floating state. Thereby, when the read voltages VR1 and VR2 are applied to the bit line BL, the charging potential of the bit line bBL is obtained as output from the selected cell.

In the read operation of the MRAM1 of this embodiment, not only the charging potential of the bit line bBL but also a current flowing through a certain node (interconnect) may be handled as output from the selected cell. In this case, in the MRAM1 of this embodiment, when the two different voltages VR1 and VR2 are applied to the bit line BL, a difference in current flowing through a certain node (interconnect) is amplified by the sense amplifier circuit, whereby the read operation is executed.

Based on the above principle, in the MRAM of this embodiment, at the time of data read operation, output from the selected cell in the case where the read voltage VR1 having a certain voltage value is applied to the selected cell in a certain period W1 is compared with output from the selected cell in the case where the read voltage VR2 having a voltage value higher than that of the voltage VR1 is applied to the selected cell in a certain period W2.

Based on the comparison result, the MRAM of this embodiment can discriminate the data in the selected cell.

Consequently, the MRAM of this embodiment can read the data in the memory cell by the self-reference method.

(b-3) Basic Example

A basic example of the read operation of the MRAM of this embodiment will be described with reference to FIG. 7.

In this example, the read operation of the MRAM of this embodiment will be described using FIGS. 1 to 6 as appropriate.

Figure 7:
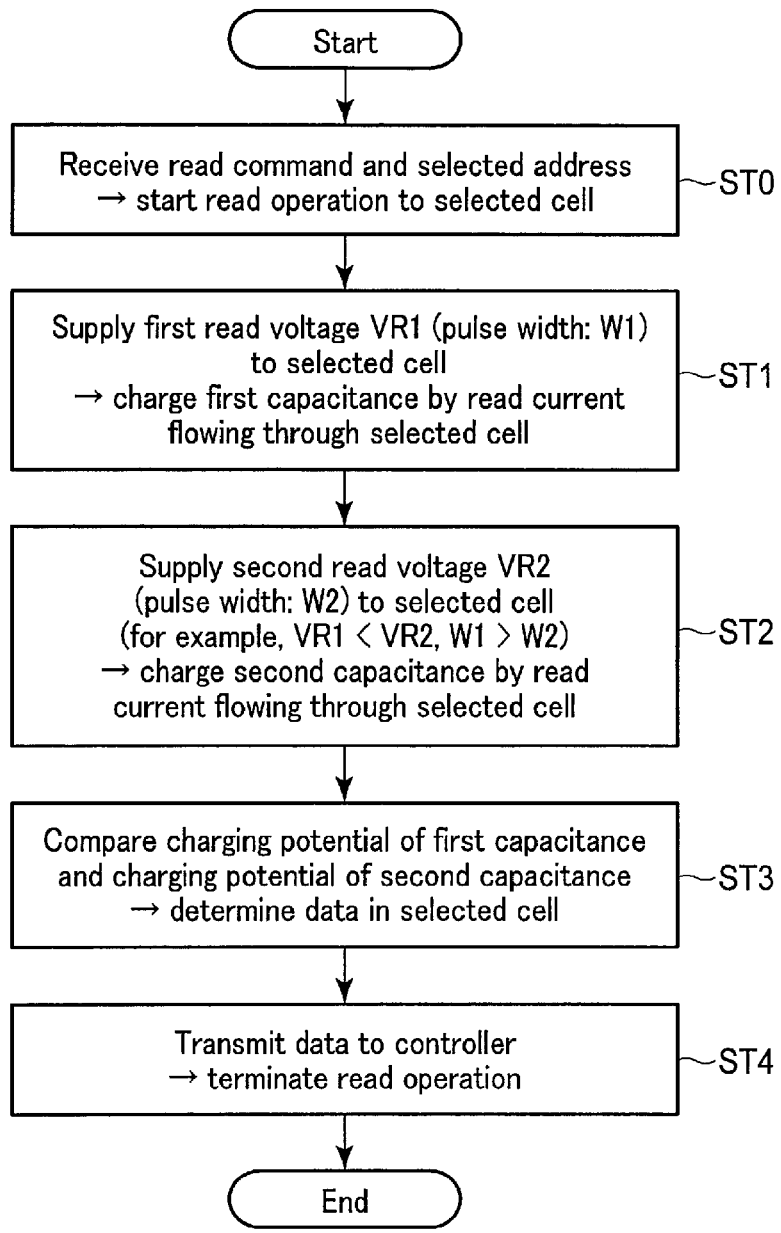
FIG. 7 is a flowchart showing an operation example of a magnetic memory of a first embodiment.

FIG. 7 is a flowchart for explaining the basic example of the read operation of the MRAM of this embodiment.

As shown in FIG. 7, the memory controller 5 issues a read command CMD in response to a request from the host device. The memory controller 5 transmits the read command CMD to the MRAM1 of this embodiment. The memory controller 5 refers to the management table and transmits to the MRAM1 the address ADR in which data to be read is stored.

The MRAM1 of this embodiment receives the read command CMD and the address ADR. Consequently, the MRAM1 of this embodiment starts the read operation for the selected cell indicated by the address ADR (step ST0).

In this embodiment, the control circuit 18 executes first reading as a sequence of the read operation (step ST1).

For the execution of the first reading (hereinafter also referred to as first sense operation), the read driver 150 supplies the first read voltage VR1, generated by the voltage generation circuit 17, to the selected cell MC via the selected global bit line GBL and the selected local bit line BL. For example, the first read voltage VR1 has the first pulse width W1.

Upon application of the first read voltage VR1, the selected cell MC outputs a read current (hereinafter referred to as a read current IR1) to the local bit line bBL and the global bit line bGBL.

A current value of the read current IR1 and the potential of a node connected to the selected cell MC vary according to the resistance state (P state or AP state) of the MTJ element 100 in the selected cell MC.

For example, in this embodiment, a charge due to the read current IR1 (or the potential of the node) is accumulated in a first capacitance (for example, interconnect capacitance) between the bit lines bBL and bGBL and one of input terminals of the sense amplifier circuit 151.

In the first reading, in the period T1 corresponding to the first pulse width W1, the first capacitance is charged by the first read voltage VR1. Consequently, the first capacitance holds a first potential (first charging potential).

After the first reading (application of the read voltage VR1), the control circuit 18 executes second reading as a sequence of the read operation (step ST2).

For the execution of the second reading (hereinafter also referred to as second sense operation), the read driver 150 supplies the second read voltage VR2, generated by the voltage generation circuit 17, to the selected cell MC via the selected bit lines BL and GBL. A voltage value of the second read voltage VR2 is higher than a voltage value of the first read voltage VR1. For example, the voltage value of the second read voltage VR2 is lower than the voltage value of the write voltage VW.

The second read voltage VR2 has the second pulse width W2. The pulse width W2 of the second read voltage VR2 is smaller than the pulse width W1 of the first read voltage VR1. The pulse widths W1 and W2 are set by an element (MTJ element) having a resistance value between the resistance value of the MTJ element in the P state and the resistance value of the MTJ element in the AP state at the time of the application of the voltages VR1 and VR2, based on a period until a certain node is charged to a certain voltage value Vref.

Upon application of the second read voltage VR2, a selected cell MCk outputs a read current (hereinafter referred to as a read current IR2) to a local bit line bBLk and the global bit line bGBL.

A charge is accumulated in a second capacitance (interconnect capacitance) between the bit lines bBL and bGBL and the other input terminal of the sense amplifier circuit 151 by the read current IR2 according to the resistance state of the MTJ element 100 in the selected cell MCk.

At the time of the second reading, in the period T2 corresponding to the second pulse width W2, the second capacitance is charged. Consequently, the second capacitance holds a second potential (second charging potential).

After the second reading, the sense amplifier circuit 151 compares the first charging potential and the second charging potential under control of the control circuit 18 (step ST3).

As shown in FIG. 6, when the selected cell MC includes the MTJ element in the P state, the first charging potential Vp1 is higher than the second charging potential Vp2.

Thus, when the first charging potential is higher than the second charging potential, the sense amplifier circuit 151 determines that the data in the selected cell MC is the "0" data.

On the other hand, when the selected cell MC includes the MTJ element in the AP state, the first charging potential Vap1 is lower than the second charging potential Vap2.

When the first charging potential is lower than the second charging potential, the sense amplifier circuit 151 determines that the data in the selected cell MC is the "1" data.

In this manner, the MRAM1 of this embodiment determines the data in the selected cell based on the comparison result of the charging potential.

The sense amplifier circuit 151 transmits the data, obtained based on the comparison result of the charging potential, to the memory controller 5 (step ST4). The MRAM1 of this embodiment completes the read operation after transmitting the data.

As described above, the MRAM1 of this embodiment ends the read operation.

In the read operation of the MRAM of this embodiment, after the second reading using the second read voltage VR2 (>VR1), the first reading using the first read voltage VR1 may be executed.

As described above, in the read operation of the MRAM1 of this embodiment, depending on the resistance state (magnetization alignment state) of the MTJ element 100 in the selected cell MCk, the magnitude relation between the first charging potential according to the first reading and the second charging potential according to the second reading is different.

Consequently, the MRAM of this embodiment can read the data in the selected cell by the self-reference method.

In the MRAM of this embodiment, data read operation by the self-reference method can be executed without changing the magnetization alignment state of the MTJ element (without destroying the data of the selected cell) between the first reading (step ST2) and the second reading (step ST3).

Thus, the MRAM of this embodiment can reduce the operation (write operation) for changing the magnetization alignment state of the MTJ element during the period of the read operation by the self-reference method. As a result, the MRAM of this embodiment can shorten an operation period for the read operation using the self-reference method.

However, in the second reading (step ST3), since the second read voltage VR2 higher than the first read voltage VR1 is applied to the bit line BL, data writing by the STT is executed to the MTJ element 100 by a current caused by the potential difference between the bit lines, and there is a possibility that the magnetization alignment state of the MTJ element 100 is changed.

However, as described with reference to FIG. 5, as the voltage VR2 applied to the MTJ element 100 increases, the resistance value of the MTJ element 100 in the AP state decreases. As a result, in the second reading (step ST3), the resistance value of the MTJ element 100 in the AP state is close to the resistance value of the MTJ element 100 in the P state.

Since the MRAM1 of this embodiment performs read operation by using the change of the resistance value (voltage dependence), even if the magnetization alignment state of the MTJ element 100 changes during the read operation, there is no adverse effect on the read operation itself.

In the MRAM of this embodiment, if the direction of a read current is set to a certain constant direction (for example, a direction for writing from the AP state to the P state), even if the magnetization alignment state of the MTJ element 100 changes at the time of the second reading (step ST3), when a write current in a predetermined direction (for example, a direction for writing from the P state to the AP state) is made flow through the MTJ element in the magnetization alignment state in which magnetization switching may occur after completion of the read operation using the self-reference method, the MRAM1 of this embodiment can correctly restore the magnetization alignment state (data holding state) of the MTJ element.

In this case, since it is sufficient to restore the magnetization alignment state of the MTJ element 100 after completion of the read operation, delay time in the read operation does not occur in the MRAM of this embodiment.

(c) Specific Example

A specific example of the MRAM of this embodiment will be described with reference to FIGS. 8 and 9. In this example, the specific example of the MRAM of this embodiment will be described using FIGS. 1 to 7 as appropriate.

(c-1) Circuit Configuration

A more specific circuit configuration of the MRAM of this embodiment will be described with reference to FIG. 8.

FIG. 8 is an equivalent circuit diagram showing a specific example of a read circuit of the MRAM of this embodiment. In FIG. 8, a main portion of the read circuit of the MRAM of this embodiment is illustrated.

As shown in FIG. 8, during the read operation of the MRAM, the read driver 150 is electrically connected to the selected cell MCk, from which data is to be read, via the selected bit lines BL and GBL and a column select switch (not shown).

The read driver 150 is connected to the global bit line GBL, for example.

The read driver 150 outputs either one of the plurality of read voltages VR1 and VR2 to the selected cell MCk based on the control signals (read enable signals) RE1 and RE2.

A transistor TR3 outputs the read voltage VR1. One end of a current path of the transistor TR3 is connected to a voltage terminal 991. The other end of the current path of the transistor TR3 is connected to the global bit line GBL. The read enable signal RE1 is supplied to the gate of the transistor TR3. The read enable signal RE1 is supplied from the control circuit 18, for example.

A transistor TR4 outputs the read voltage VR2 (>VR1). One end of a current path of the transistor TR4 is connected to a voltage terminal 992. The other end of the current path of the transistor TR4 is connected to the global bit line GBL. The read enable signal RE2 is supplied to the gate of the transistor TR4. The read enable signal RE2 is supplied from the control circuit 18, for example.

The timings of supplying the read voltages VR1 and VR2 to the selected cell MCk in the read driver 150 are each independently controlled by the read enable signals RE1 and RE2.

For example, the pulse widths W1 and W2 of the read voltages VR1 and VR2 are controlled by controlling a period during which the read enable signals RE1 and RE2 are at "H" level.

A clamp transistor may be provided between the read driver 150 and the global bit line GBL. The clamp transistor can clamp the potential of the global bit line GBL at not more than a supplied gate voltage. In this case, the read driver 150 includes, for example, a single voltage source to which a voltage not less than the read voltage VR2 is applied. The first read voltage VR1 and the second read voltage VR2 may be generated by controlling the signal level of a control signal supplied to the gate of the clamp transistor.

As shown in FIG. 8, during the read operation of the MRAM, the sense amplifier circuit 151 is electrically connected to the selected cell MCk via the selected bit lines bBL and bGBL and a column select switch (not shown).

In this embodiment, a charge integration type differential sense amplifier circuit is used for the sense amplifier circuit 151.

The sense amplifier circuit 151 at least includes a sense amplifier unit 50, two charge holding portions 981 and 982, and a plurality of control elements SW1, SW2, TR1, and TR2.

The control elements SW1 and SW2 control an electrical connection between the sense amplifier circuit 151 and the global bit line bGBL. The control elements SW1 and SW2 are, for example, MOS switches.

The control elements TR1 and TR2 control an electrical connection between the sense amplifier unit 50 and the charge holding portions 981 and 982. The control elements TR1 and TR2 are, for example, N type field effect transistors.

One end of the switch element SW1 is connected to the global bit line bGBL. The other end of the switch element SW1 is connected to one end of a current path of the transistor TR1. The other end of the current path of the transistor TR1 is connected to an input terminal (node) ND1 as one of input terminals of the sense amplifier unit 50.

One end of the switch element SW2 is connected to the global bit line bGBL. The other end of the switch element SW2 is connected to one end of a current path of the transistor TR2. The other end of the current path of the transistor TR2 is connected to an input terminal (node) ND2 as the other input terminal of the sense amplifier unit 50.

The control signal (read enable signal) RE1 is supplied to the gate of the switch element SW1. The read enable signal RE2 is supplied to the gate of the switch element SW2. The signals RE1 and RE2 are supplied to the gates of P-type MOS transistors of the MOS switch elements SW1 and SW2 via an inverter 950.

The turning on and off states of the switch elements SW1 and SW2 are each independently controlled based on the read enable signals RE1 and RE2. Consequently, electrical connections between the selected bit lines bBLk and bGBL and the charge holding portions 981 and 982 are controlled, respectively.

In this way, the timing of acquiring an output signal from the selected cell MCk in the sense amplifier circuit 151 is controlled by the read enable signals RE1 and RE2.

The control signal (sense enable) SE is supplied to the gates of the transistors TR1 and TR2. The sense enable signal SE is supplied from the control circuit 18, for example.

The turning on and off states of the transistors TR1 and TR2 are controlled based on the sense enable signal SE. Consequently, the electrical connection between the charge holding portions 981 and 982 and the sense amplifier unit 50 is controlled. As a result, the timing of latching signals (output from the selected cell) of the charge holding portions 981 and 982 in the sense amplifier unit 50 is controlled by the sense enable signal SE.

The charge holding portions 981 and 982 have, for example, capacitors C1 and C2 of a certain size. The charge holding portions 981 and 982 hold charges caused by currents flowing in the selected bit lines bBLk and bGBL (or variations in the potentials of the selected bit lines bBLk and bGBL) at different timings.

The charge holding portion 981 is provided between the switch element SW1 and the transistor TR1. One end of the charge holding portion 981 is connected to a connection node between the switch element SW1 and the transistor TR1. The other end of the charge holding portion 981 is grounded.

The charge holding portion 982 is provided between the switch element SW2 and the transistor TR2. One end of the charge holding portion 982 is connected to a connection node between the switch element SW2 and the transistor TR2. The other end of the charge holding portion 982 is grounded.

For example, each of the charge holding portions 981 and 982 is an interconnect capacitance (parasitic capacitance) between the switch elements SW1 and SW2 and the transistors TR1 and TR2. However, a capacitance element (for example, a MOS capacitor mounted using a gate capacitance or junction capacitance of a transistor or the like or MIM capacitor) may be provided as the charge holding portions 981 and 982 on the semiconductor substrate 290 or in an interlayer insulating film.

The sense amplifier unit 50 includes a plurality of P-type field effect transistors (for example, P-type MOS transistors) TRa, TRb, TRd, and TRe and a plurality of N-type field effect transistors (for example, N-type MOS transistors) TRc, TRf, TRg, TRh, and TRi.

The transistors TRa to TRf form a flip-flop.

One end (source/drain) of a current path of the transistor TRa is connected to a voltage terminal 990. The other end (source/drain) of the current path of the transistor TRa is connected to one end of a current path of the transistor TRb. The other end of the current path of the transistor TRb is connected to the node (interconnect) ND1. One end of a current path of the transistor TRc is connected to the node ND1. The other end of a current path of the transistor TRe is connected to a voltage terminal 999.

The gates of the transistors TRb and TRc are connected to the node ND2.

A power supply voltage VDD is applied to the voltage terminal 990. Hereinafter, the voltage terminal 990 to which the power supply voltage VDD is applied is referred to as the power supply terminal 990.

A ground voltage VSS is applied to the voltage terminal 999. Hereinafter, the voltage terminal 999 to which the ground voltage VSS is applied is called the ground terminal 999.

One end of a current path of the transistor TRd is connected to the power supply terminal 990, and the other end of the current path of the transistor TRd is connected to one end of the current path of the transistor TRe. The other end of the transistor TRe is connected to the node ND2. One end of a current path of the transistor TRf is connected to the node ND2. The other end of the current path of the transistor TRf is connected to the ground terminal 999.

The gates of the transistors TRe and TRf are connected to the node ND1.

A control signal (sense enable signal) bSE is supplied to the gates of the transistors TRa and TRd. The turning on and off states of the transistors TRa and TRd are controlled based on the sense enable signal bSE. As a result, activation and deactivation of the sense amplifier unit 50 is controlled. The sense enable signal bSE is supplied from the control circuit 18, for example.

The timing of the detection and amplification operation of a signal in the sense amplifier circuit 151 is controlled by the sense enable signals SE and bSE.

The transistors TRg, TRh, and TRi control the discharge of the internal nodes ND1 and ND2 of the sense amplifier unit 50.

One end of a current path of the transistor TRg is connected to the node ND1. One end of the current path of the transistor TRg is connected to the ground terminal 999. One end of a current path of the transistor TRh is connected to the node ND2. The other end of the current path of the transistor TRh is connected to the ground terminal 999.

One end of a current path of the transistor TRi is connected to the node ND1 and one end of the current path of the transistor TRg. The other end of the current path of the transistor TRi is connected to the node ND2 and one end of the current path of the transistor TRh.

A control signal (pre-discharge enable signal) PDE is supplied to the gates of the transistors TRg, TRh, and TRi. The timing of initialization operation of the sense amplifier circuit 151 (discharge of the node) is controlled by the pre-discharge enable signal PDE.

The node ND2 of the sense amplifier unit 50 is used as the input terminal of the sense amplifier unit 50 and as the output terminal DOUT of the sense amplifier unit 50. The potential of the node ND2 is output as data in the selected cell MCk from an output terminal of the sense amplifier circuit 151.

The node ND1 of the sense amplifier unit 50 holds the potential of a level opposite to that of the node ND2. The potential of the node ND1 is handled as complementary data of the data in the selected cell MCk. Consequently, the sense amplifier circuit 151 can output the potential of the node ND1 as complementary data of the selected cell MCk. For example, the node ND1 may be used as an output terminal bDOUT of the sense amplifier unit 50.

The internal configuration of the sense amplifier circuit 151 in FIG. 8 is an example, and the internal configuration of the sense amplifier circuit used in the MRAM of this embodiment is not limited to the internal configuration in FIG. 8.

(c-2) Operation Example

A more specific operation example of the MRAM of this embodiment will be described with reference to FIG. 9.

Figure 9:
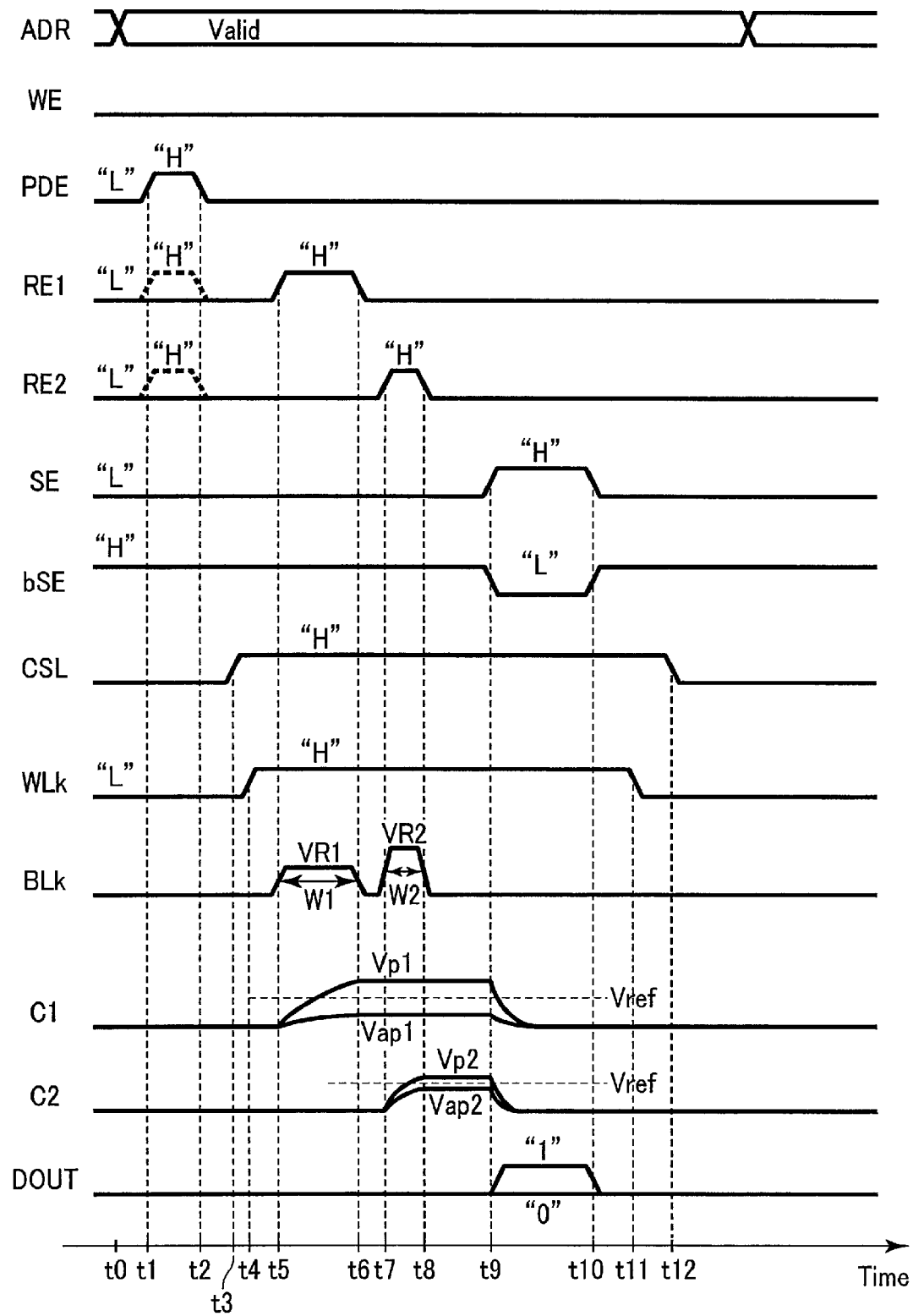
FIG. 9 is a timing chart showing the operation example of the magnetic memory of the first embodiment.

FIG. 9 is a timing chart for explaining a specific example of the read operation of the MRAM of this embodiment.

As shown in FIG. 9, after receiving the command CMD and the address ADR, the address ADR is latched in the command-address latch circuit at time t0, and the address ADR is valid.

At time t1, the control circuit 18 of the MRAM1 changes the signal level of the pre-discharge enable signal PDE from "L" level to "H" level.

The transistors TRg, TRh, and TRi are turned on in the sense amplifier circuit 151 of FIG. 8 by the signal PDE at the "H" level. The nodes ND1 and ND2 are electrically connected to the ground terminal 999 via the transistors TRg and TRh in the ON state. Further, the node ND1 is electrically connected to the node ND2 via the transistor TRi in the ON state. As a result, both the nodes ND1 and ND2 are discharged and set to substantially the same potential.

At time t2, the control circuit 18 sets the signal level of the signal PDE to the "L" level. The transistors TRg, TRh, and TRi are turned off, and the nodes ND1 and ND2 are electrically separated from the ground terminal 999.

The pre-discharge enable signal PDE may be always set to the "H" level when the read circuit 15 is inactive. Consequently, before reception of the address ADR, both the nodes ND1 and ND2 are set to a discharged state in advance. In this case, in the MRAM of this embodiment, since pre-discharge processing has been completed in advance, it is possible to skip processing from the time t0 to the time t2 after receiving the address ADR. As a result, the MRAM of this embodiment can reduce access delay and achieve high-speed read operation.

The read enable signals RE1 and RE2 may be set to the "H" level in a period from the time t1 to the time t2. Consequently, the transistors TR3 and TR4 are turned on, and the global bit line GBL is precharged. The capacitors 981 (C1) and 982 (C2) are discharged by the switch elements SW1 and SW2 in the ON state.

At time t3, the bit line control circuit 14B sets the column selection signal CSL corresponding to the selected address ADR to the "H" level. Consequently, column switches M1 and M2 are turned on, and the selected bit lines BLk and bBLk are electrically connected to the global bit lines GBL and bGBL.

At time t4, the word line control circuit 13B applies a voltage at the "H" level to the selected word line WLk. Consequently, the cell transistor 200 of the selected cell MCk is turned on. The selected cell MCk is activated. After the selected word line WLk is activated, the selected bit lines BLk and bBLk may be activated.

At time t5, the control circuit 18 changes the signal level of the first read enable signal RE1 from the "L" level to the "H" level. The transistor TR3 of the two transistors TR3 and TR4 in the read driver 150 is turned on by the signal RE1 at the "H" level.

The voltage terminal 991 is connected to the global bit line GBL and the selected bit line BLk via the transistor TR3 in the ON state.

Consequently, the read voltage VR1 is supplied to the selected cell MCk, and the voltage VR1 is applied to the MTJ element 100. The read current IR1 flows from the bit line BLk to the bit line bBLk via the MTJ element 100.

The switch element SW1 is turned on by the signal RE1 at the "H" level. The charge holding portion (interconnect capacitance) 981 is electrically connected to the bit line bBLk and the global bit line bGBL.

The read current IR1 is supplied to the charge holding portion 981, whereby the node is charged, and the potential of the charge holding portion 981 rises.

The current value of the read current IR1 has a magnitude corresponding to the resistance value (magnetization alignment state) of the MTJ element. The current value of the read current IR1 flowing through the MTJ element 100 in the parallel alignment state is higher than the current value of the read current IR1 flowing through the MTJ element 100 in the antiparallel alignment state. Thus, the height of the charging potential in the charge holding portion 981 varies according to the resistance state of the MTJ element in the selected cell MCk.

The control circuit 18 controls the signal level of the first read enable signal RE1 such that the first read voltage VR1 having a certain pulse width W1 is applied to the selected cell MCk.

A period during which the first read enable signal RE1 is at the "H" level is controlled such that the read voltage VR1 has the pulse width W1.

At time t6, the control circuit 18 changes the signal level of the signal RE1 from the "H" level to the "L" level. Consequently, the transistor TR3 is turned off, and the voltage terminal 991 is electrically separated from the selected bit line BLk.

A period from the time t5 to the time t6 substantially corresponds to the pulse width W1 of the read voltage VR1. The pulse widths of the read voltages VR1 and VR2 correspond to the full width at half maximum of the read voltages VR1 and VR2, for example. However, the pulse widths of the read voltages VR1 and VR2 may be defined based on a period during which the read voltage has a desired voltage value.

Consequently, in the period corresponding to the pulse width W1 (period between the times t5 and t6), the capacitor C1 (charge holding portion 981) is charged. The capacitor C1 holds the charging potential according to the resistance state of the MTJ element 100 and the charging period W1. When the MTJ element 100 is in the P state (low resistance state), the capacitor C1 has the charging potential Vp1, and when the MTJ element 100 is in the AP state (high resistance state), the capacitor C1 has the charging potential Vap1.

At time t7, the control circuit 18 changes the signal level of the second read enable signal RE2 from the "L" level to the "H" level. The transistor TR4 as the other transistor in the read driver 150 is turned on by the signal RE2 at the "H" level.

The voltage terminal 992 is connected to the global bit line GBL and the selected bit line BLk via the transistor TR4 in the ON state.

Consequently, the read voltage VR2 is supplied to the selected cell MCk and applied to the MTJ element 100. The read current IR2 flows from the bit line BLk to the bit line bBLk via the MTJ element 100.

The charge holding portion (interconnect capacitance) 982 is electrically connected to the bit line bBLk and the global bit line bGBL by the signal RE2 at the "H" level via the switch element SW2 in the ON state.

The read current IR2 is supplied to the charge holding portion 982, whereby the node is charged, and the potential of the charge holding portion 981 rises.

As described with reference to FIG. 5, when the read voltage VR2 higher than the voltage VR1 is applied to the MTJ element 100, while the magnetization alignment state of the MTJ element 100 is maintained by the voltage dependence of the resistance value of the MTJ element 100, the resistance value of the MTJ element 100 decreases.

The control circuit 18 controls the signal level of the second read enable signal RE2 such that the second read voltage VR2 has the second pulse width W2 smaller than the first pulse width W1.

For example, the pulse width W2 of the read voltage VR2 is set such that the charging potential of the node according to the MTJ element having the resistance value between the resistance value of the MTJ element in the P state and the resistance value of the MTJ element in the AP state at the time of the application of the read voltage VR2 is the same value as the charging potential of the node according to the MTJ element having the resistance value between the resistance value of the MTJ element in the P state and the resistance value of the MTJ element in the AP state at the time of the application of the read voltage VR1 having the pulse width W1.

At time t8, the control circuit 18 changes the signal level of the signal RE2 from the "H" level to the "L" level. The transistor TR4 is turned off, and the voltage terminal 992 is electrically separated from the selected bit line BLk.

A period from the time t7 to the time t8 substantially corresponds to the pulse width W2 of the read voltage VR2.

Consequently, in the period corresponding to the pulse width W2 (period between the times t7 and t8), the capacitor C2 (charge holding portion 982) is charged. The capacitor C2 holds the charging potential according to the resistance state of the MTJ element 100 and the charging period W2. When the MTJ element 100 is in the P state (low resistance state), the capacitor C2 has the charging potential Vp2, and when the MTJ element 100 is in the AP state (high resistance state), the capacitor C2 has the charging potential Vap2.

After the signal level of the signal RE2 is set to the "L" level, the control circuit 18 changes the signal level of the sense enable signal SE from the "L" level to the "H" level at time t9. In synchronism with the signal SE being set to the "H" level, the signal level of the signal bSE changes from the "H" level to the "L" level.

The transistors TR1 and TR2 are turned on by the signal SE at the "H" level. The transistors TRa and TRd are turned on by the signal bSE at the "L" level.

The transistors TRb, TRc, TRe, and TRf are electrically connected to the power supply terminal 990 via the transistors TRa and TRd in the ON state. Consequently, a voltage Vdd is supplied to the transistors TRb, TRc, TRe, and TRf.

The charge holding portions 981 and 982 are connected respectively to the nodes ND1 and ND2 via the transistors TR1 and TR2 in the ON state.

The potential (charge) of the charge holding portion 981 is transferred to the node ND1, and the potential of the charge holding portion 982 is transferred to the node ND2. The potential of the node ND1 is applied to the gates of the transistors TRe and TRf. The potential of the node ND2 is applied to the gates of the transistors TRb and TRc.

When the charging potential in the first reading (reading using the voltage VR1) is lower than the charging potential in the second reading (reading using the voltage VR2), depending on the transferred charge (charging potential), the potential of the node ND2 is relatively higher than the potential of the node ND1.

As a result, the node ND1 is discharged by the transistor TRb in the OFF state and the transistor TRc in the ON state, and the node ND2 is charged to approximately the power supply voltage Vdd by the transistor TRe in the ON state and the transistor TRf in the OFF state.

The potential of the node ND1 is set to the "L" level, and the potential of the node ND2 is set to the "H" level.

When the charging potential in the first reading is higher than the charging potential in the second reading, depending on the transferred charge, the potential of the node ND1 is relatively higher than the potential of the node ND2.

As a result, the node ND1 is charged to approximately the power supply voltage Vdd by the transistor TRb in the ON state and the transistor TRc in the OFF state, and the node ND2 is discharged by the transistor TRe in the OFF state and the transistor TRf in the ON state.

The potential of the node ND1 is set to the "H" level, and the potential of the node ND2 is set to the "L" level.

In this manner, the comparison result between a charging potential VC1 in the first reading and a charging potential VC2 in the second reading is reflected as charging/discharging of the nodes ND1 and ND2.

As described with reference to FIG. 6, in the MTJ element in the P state, the charging potential Vp1 in the first reading is higher than the charging potential Vp2 in the second reading. As described with reference to FIG. 6, in the MTJ element in the AP state, the charging potential Vap1 in the first reading is lower than the charging potential Vap2 in the second reading.

As shown in (a) and (b) of FIG. 6, in the application of the read voltages VR1 and VR2 having the pulse widths W1 and W2 considering an arrival period to a certain potential Vref, when the magnetization alignment state of the MTJ element 100 is the P state, the potential of the node ND2 is lower than the potential of the node ND1.

Accordingly, when the potential of the node ND2 is at the "L" level, the "0" data is determined as the data stored in the selected cell MCk.

When the magnetization alignment state of the MTJ element 100 is the AP state, the potential of the node ND2 is higher than the potential of the node ND1.

Accordingly, when the potential of the node ND2 is at the "H" level (when the MTJ element 100 is in the AP state), the "1" data is determined as the data stored in the selected cell MCk.

In this manner, the data in the selected cell MCk is read.

When the MTJ element 100 in the selected cell MCk is in the P state, the "0" data is transmitted to the memory controller 5. When the MTJ element 100 in the selected cell MCk is in the AP state, the "1" data is transmitted to the memory controller 5.

At time t10, the control circuit 18 sets the signal SE to the "L" level and sets the signal bSE to the "H" level.

At time t11, the word line control circuit 13B sets the potential of the word line WLk to the "L" level. Consequently, the word line WLk is deactivated, and the cell transistor 200 is turned off.

At time t12, the bit line control circuit 14B sets the signal CSL to the "L" level. Consequently, the column switches M1 and M2 are turned off, and the bit lines BLk and bBLk are deactivated. After the bit lines BLk and bBLk are deactivated, the word line WLk may be deactivated.

Consequently, the MRAM of this embodiment completes the read operation.

The memory controller 5 receives data from the MRAM1. The memory controller 5 applies ECC processing and the like to the data, and then transfers the data to the host device.

As described above, the operation of the MRAM of this embodiment is completed.

(d) Summary

The magnetic memory (for example, MRAM) of this embodiment reads data using the read operation by the self-reference method.

In the magnetic memory of this embodiment, read errors due to variations in characteristics of memory cells (for example, variations in manufacturing process) can be reduced by the read operation by the self-reference method.

The magnetic memory of this embodiment executes the read operation by the self-reference method by utilizing the voltage dependence of the resistance value of the MTJ element.

The magnetic memory of this embodiment reads data from a selected cell by using the two read voltages VR1 and VR2 having different pulse shapes at the time of the read operation. The first read voltage VR1 is lower than the second read voltage VR2. For example, the pulse width W1 of the first read voltage VR1 is wider than the pulse width W2 of the second read voltage VR2. For example, the second read voltage VR2 is set to a voltage value and a pulse width at which the resistance state of the MTJ element 100 does not change.

The magnetic memory of this embodiment uses the voltage dependence of the resistance value of the MTJ element 100 (see FIG. 5) and discriminates and determines data in the selected cell MC based on the comparison result between the output (for example, charging potential) of the selected cell due to the supply of the first read voltage and the output of the selected cell due to the supply of the second read voltage.

As a result, in the magnetic memory of this embodiment, the read operation by the self-reference method can be achieved without destroying the data of the memory cell MC (without rewriting the resistance state of the MTJ element).

Thus, in the magnetic memory of this embodiment, it is possible to reduce the execution of the write operation for changing the resistance state of the MTJ element between the first reading and the second reading in the sequence of the read operation.

As a result, the magnetic memory of this embodiment can shorten the period of the read operation by the self-reference method.

As described above, in the magnetic memory of this embodiment, operation characteristics of the magnetic memory can be improved.

(2) Second Embodiment

A magnetic memory of the second embodiment will be described with reference to FIGS. 10 and 11.

In this embodiment, STT-MRAM will be described as an example of the magnetic memory of this embodiment.

In the MRAM of this embodiment, writeback processing is executed after read operation.

In the read operation of the MRAM of this embodiment, in order to increase a read margin (difference in charging potential) between first reading and second reading in an MTJ element in an antiparallel alignment state (AP state), a voltage value of a read voltage VR2 may be set to a higher value in some cases.

In the MRAM of this embodiment, the second read voltage VR2 may be set to a voltage value not less than a write voltage VW at the time of the second reading. In the MRAM of this embodiment, at the time of the second reading, when the application period of the second read voltage VR2 is sufficiently smaller than the application time of the write voltage VW, the second read voltage VR2 may be set to a voltage value higher than the write voltage VW in some cases.

In these cases, there is a possibility that magnetization switching of the MTJ element may occur due to a characteristic variation of the MTJ element in the memory cell array.

A direction in which a read current flows in the MTJ element is a direction in which the magnetization alignment state of the MTJ element changes from the AP state to the P state. Thus, due to the characteristic variation of the MTJ element, the magnetization alignment state of the MTJ element in the AP state may be changed to the P state by the read current.

Depending on a configuration of the MTJ element and a connection relation to a bit line, the direction of the read current may be different from the direction of the read current shown in FIGS. 4A and 4B. Due to this, it is also possible to make the magnetization alignment state of the MTJ element change from the P state to the AP state.

Regardless of the direction of the read current, as described with reference to FIG. 5, as the voltage VR2 applied to the MTJ element 100 increases, the resistance value of the MTJ element 100 in the AP state decreases, and at the time of the second reading, the resistance value of the MTJ element in the AP state is close to the resistance value of the MTJ element in the P state.

Conversely, the resistance value of the MTJ element in the P state substantially maintains the resistance value of the MTJ element in the P state even if the applied voltage increases.

In the MRAM of this embodiment, since the read operation is performed by using the change of the resistance value, even if the magnetization alignment of the MTJ element changes at the time of the second reading, the read operation is not affected. However, if the magnetization alignment of the MTJ element changes at the time of the read operation, in order to maintain the reliability of data in a memory, it is preferable that the magnetization alignment of the MTJ element is restored to the state before the change in the magnetization alignment due to the read operation.

In order to reduce errors caused by read disturbs as described above, the MRAM of this embodiment executes writeback processing after transferring data to the memory controller 5. In the following description, for simplicity of explanation, it is assumed that a direction in which a read current flows in the MTJ element 100 is a direction in which the magnetization alignment state of the MTJ element 100 changes from the AP state to the P state.

Figure 10:
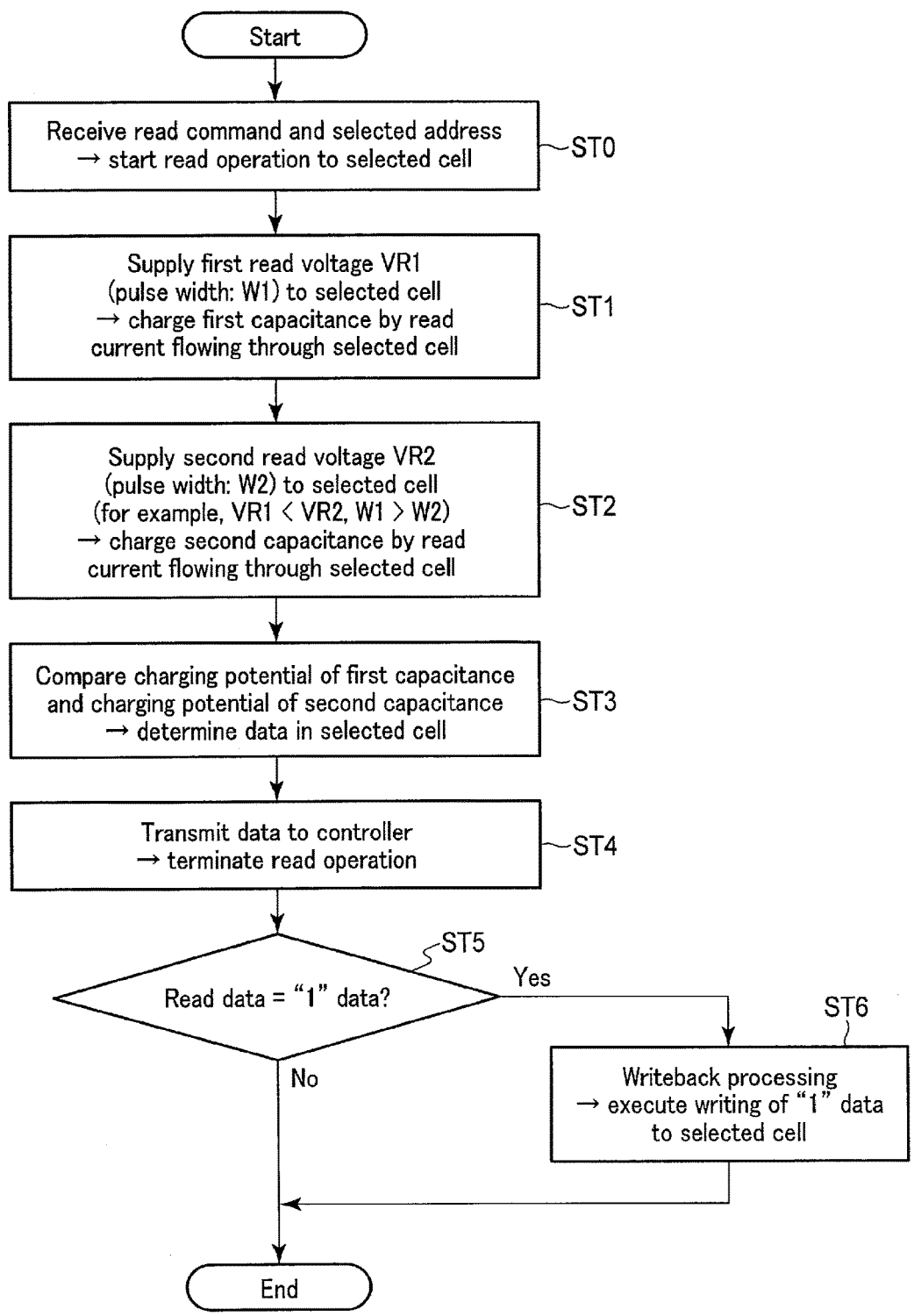
FIG. 10 is a flowchart showing an operation example of a magnetic memory of a second embodiment.

FIG. 10 is a flowchart for explaining the read operation of the magnetic memory (for example, MRAM) of this embodiment. FIG. 11 is a timing chart for explaining the read operation of the MRAM of this embodiment.

As shown in FIG. 10, after data is transmitted to the memory controller 5, a control circuit 18 determines whether or not the read data is "1" data corresponding to the AP state (step ST6).

Here, since a direction in which a read current IR flows in the MTJ element 100 is set to the direction in which the magnetization alignment state of the MTJ element 100 changes from the AP state to the P state, an MTJ element having a possibility of causing read disturbs is an MTJ element in the AP state.

When the read data is the "1" data, the MRAM of this embodiment executes the writeback processing on the selected cell from which the "1" data has been read (step ST7).

Figure 11:
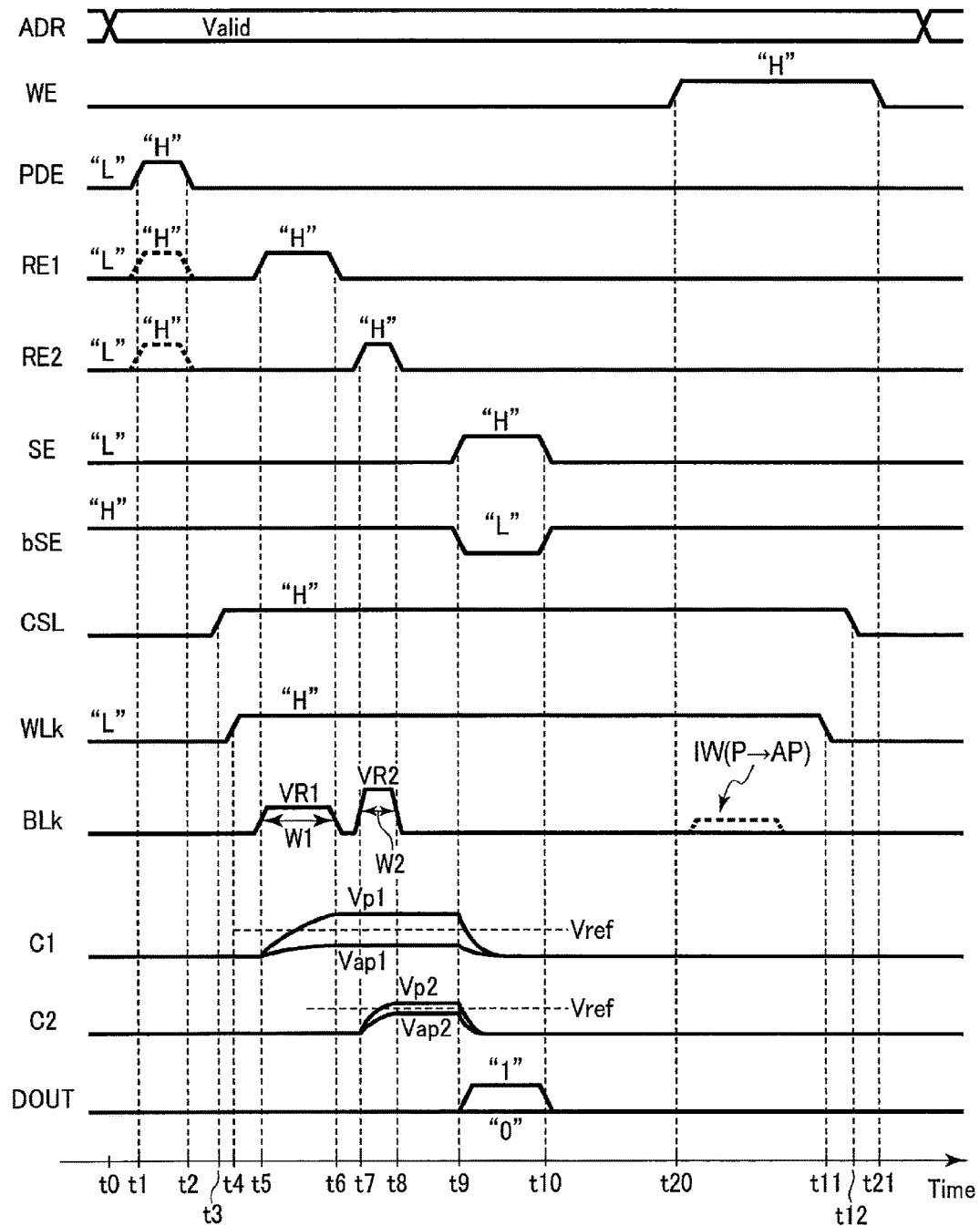
FIG. 11 is a timing chart showing the operation example of the magnetic memory of the second embodiment.

As shown in FIG. 11, the control circuit 18 changes the signal level of a write enable signal WE from "L" level to "H" level at time t20 after deactivating a read circuit 15 (time t10). Consequently, a write circuit 16 is activated.

A write driver 161 activates each interconnect and controls the potential of each interconnect such that the "1" data is written to a selected cell MCk from which the "1" data has been read.

When the MRAM of this embodiment is STT-MRAM, the write drivers (drivers/sinkers) 160 and 161 supply a write current IW2 for writing the "1" data to the selected cell MCk to be subjected to the writeback processing.

When the magnetization alignment state of the MTJ element 100 in the selected cell MCk is the AP state, the magnetization alignment state of the MTJ element 100 does not change even if the write current IW2 flows in the MTJ element 100.

When the magnetization alignment state of the MTJ element 100 in the selected cell MCk is changed from the AP state to the P state by read disturbs, the magnetization alignment state of the MTJ element 100 is returned from the P state to the AP state by the write current IW2.

For example, after the supply of the write current IW2, the control circuit 18 deactivates the word line WLk and the bit line BLk at time t21 (times t11 and t12) and then changes the signal level of the write enable signal WE from the "H" level to the "L" level without verifying a write result to the selected cell MCk (without program verify).

The write circuit 16 is deactivated by the signal WE at the "L" level. In the writeback processing, program verify may be executed after writing the "1" data.

Consequently, the MRAM of this embodiment completes the writeback processing after transferring the data to the memory controller 5.

When the read data is "0" data, the MRAM of this embodiment completes operation without executing the writeback operation.

In the second embodiment, as in the first embodiment, a pre-discharge enable signal PDE may be always set to the "H" level when the sense amplifier circuit 151 is inactive. Consequently, before reception of an address ADR, both nodes ND1 and ND2 are discharged in advance. In this case, in the MRAM of this embodiment, since pre-discharge processing has been completed in advance, the processing from the time t0 to the time t2 can be reduced after the reception of the address ADR. As a result, the MRAM of this embodiment can speed up the read operation.

As described above, in the MRAM of this embodiment, read disturbs can be reduced by the writeback processing for the selected cell.

In the MRAM of this embodiment, regardless of the data read from the memory cell, the writeback processing may be executed even when data is the "0" data or "1" data.

In this embodiment, the writeback processing is executed after data transfer from the MRAM1 to the memory controller 5.

Thus, in the memory system including the MRAM1 of this embodiment, even if the MRAM1 of this embodiment executes the writeback operation, there is hardly any adverse effect on the performance (data transfer efficiency) of data transfer on the memory controller side.

As described above, the magnetic memory of this embodiment can improve the reliability of data without deteriorating the operation performance.

(3) Third Embodiment

A magnetic memory of the third embodiment will be described with reference to FIGS. 12 to 15.

(a) Circuit Configuration

The magnetic memory (for example, MRAM) of this embodiment includes a circuit which can automatically control pulse widths of two read voltages VR1 and VR2 to desired pulse widths. Hereinafter, the circuit configured to control the pulse widths of the read voltages VR1 and VR2 is referred to as a pulse width control circuit.

A pulse width control circuit 40 is a circuit including a reference cell RC.

FIG. 12 is a schematic diagram for explaining a configuration example of an MRAM of this embodiment.

As shown in FIG. 12, the reference cell RC is provided in a reference region RA in a memory cell array 10 of an MRAM1.

The reference region RA is provided on one end side of the memory cell array 10. The reference region RA is provided adjacent to a region (referred to as a memory cell region) MA in which memory cells MC are aligned. The reference region RA has a structure similar to the memory cell region MA.

The reference cell RC is electrically connected to a circuit 400 in the pulse width control circuit 40. The circuit 400 is provided outside the memory cell array 10. However, the circuit 400 may be provided inside the memory cell array 10. The circuit 400 controls the potentials of control lines 491 and 492 (the signal level of a control signal) based on output (voltage or current) from the reference cell RC.

At least one read driver 150R and at least one sense amplifier circuit 151R are provided for the reference region RA. The read driver 150R is electrically connected to the reference cell RC via various interconnects. The read driver 150B for the reference cell RC is connected to voltage terminals (voltage lines) 991 and 992 common to the read driver 150 for the memory cell MC.

For example, when a plurality of control units MX are set in the memory cell region MA, the read driver 150 and a sense amplifier circuit 151 are provided to each of the control units (for example, global bit line pair) MX.

Control signals from the circuit 400 are supplied to the respective read drivers 150 and 150R via the control lines 491 and 492. Consequently, the timings of outputting the read voltages VR1 and VR2 from the read driver 150 are controlled.

FIG. 13 is an equivalent circuit diagram for explaining the pulse width control circuit in the MRAM of this embodiment. In FIG. 13, a main part of the pulse width control circuit is extracted and illustrated. In FIG. 13, for ease of illustration, the reference cell is illustrated.

As shown in FIG. 13, the reference cell RC is connected between bit lines RL and bRL. In the following description, the bit lines RL and bRL connected to the reference cell RC are referred to as reference bit lines RL and bRL for clarification of explanation.

The reference bit lines RL and bRL are connected to global bit lines GRL and bGRL via a column select switch (not shown). In the following description, the global bit lines GRL and bGRL corresponding to the reference cell RC are referred to as reference global bit lines GRL and bGRL for clarification of explanation.

The reference cell RC is connected to a word line WLk common to the memory cell MC.

The reference cell RC includes an MTJ element 100A in a P state, an MTJ element 100B in an AP state, and two cell transistors 200A and 200B.

One end of each of the MTJ elements 100A and 100B is connected to the reference bit line RL. The other end of the MTJ element 100A is connected to one end of the cell transistor 200A. The other end of the MTJ element 100B is connected to one end of the cell transistor 200B. The other ends of the cell transistors 200A and 200B are connected to the reference bit line bRL.

The MTJ element 100A in the P state and the MTJ element 100B in the AP state are connected in parallel between the bit line BL and the bit line bBL.

Consequently, the resistance value of the reference cell RC is a value between the resistance value of the MTJ element in the P state and the resistance value of the MTJ element in the AP state.

The pulse width control circuit 40 includes two monitor circuits 400A and 400B as the above circuit 400.

The first monitor circuit 400A includes a P-type transistor 411, N-type transistors 412 and 413, and an AND gate 416.

One end of a current path of the transistor 411 is connected to a power supply terminal 990. The other end of the current path of the transistor 411 is connected to a node NDa.

One end of the current path of the transistor 412 is connected to the node NDa. The other end of the current path of the transistor 412 is connected to one end of a current path of the transistor 413. The other end of the current path of the transistor 413 is connected to a ground terminal 999.

A read enable signal RE1 is supplied to the gates of the transistors 411 and 413.

Output (charging potential) of the reference cell RC is supplied to the gate of the transistor 412 via the bit lines bRL and bGRL and the like.

One of input terminals of the AND gate 416 is connected to the node NDa. The read enable signal RE1 is supplied to the other input terminal of the AND gate 416. An output terminal of the AND gate 416 is connected to the control line 491.

A calculation result of the AND gate 416 is supplied as a control signal AND1 to the control line 491.

In the monitor circuit 400A, a P-type transistor 418 and an inverter 419 are connected to the node NDa.

One end of a current path of the transistor 418 is connected to the power supply terminal 990. The other end of the current path of the P-type transistor 418 is connected to the node NDa and one of the input terminals of the AND gate 416.

An input terminal of the inverter 419 is connected to the node NDa and one of the input terminals of the AND gate 416. An output terminal of the inverter 419 is connected to the gate of the transistor 418.

The transistor 418 and the inverter 419 function as a keeper circuit (hold circuit) for the node NDa. The keeper circuit can maintain the potential of the node NDa in a state before operation of the monitor circuit 400A. However, the drive force of the transistor 418 and the inverter 419 is designed such that the node NDa can be charged and discharged according to the operation of the monitor circuit 400A.

The second monitor circuit 400B includes a P-type transistor 421, N-type transistors 422 and 423, and an AND gate 426.

One end of a current path of the transistor 421 is connected to the power supply terminal 990. The other end of the current path of the transistor 421 is connected to a node NDb.

One end of a current path of the transistor 422 is connected to the node NDb. The other end of the current path of the transistor 422 is connected to one end of a current path of the transistor 423.

The other end of the current path of the transistor 423 is connected to the ground terminal 999.

A read enable signal RE2 is supplied to the gates of the transistors 421 and 423.

The output of the reference cell RC is supplied to the gate of the transistor 422 via the bit lines bRL and bGRL and the like.

One of input terminals of the AND gate 426 is connected to the node NDb. The read enable signal RE2 is supplied to the other input terminal of the AND gate 426. An output terminal of the AND gate 426 is connected to the control line 492.

A calculation result of the AND gate 426 is supplied as a control signal AND2 to the control line 492.

In the monitor circuit 400B, a P-type transistor 428 and an inverter 429 as keeper circuits are connected to the node NDb.

One end of a current path of the transistor 428 is connected to the power supply terminal 990. The other end of the current path of the transistor 428 is connected to the node NDb and one of the input terminals of the AND gate 426.

An input terminal of the inverter 429 is connected to the node NDb and one of the input terminals of the AND gate 426. An output terminal of the inverter 429 is connected to the gate of the transistor 428.

The transistor 428 and the inverter 429 can maintain the potential of the node NDb in a state before operation of the monitor circuit 400B. However, the drive force of the transistor 428 and the inverter 429 is designed such that the node NDb can be charged and discharged according to the operation of the monitor circuit 400B.

In order to form a replica circuit of the memory cell MC at the time of data reading, the reference cell RC is connected to the sense amplifier circuit 151R via the reference bit line bRL and the reference global bit line bGBL. Consequently, at the time of the read operation of the MRAM, a load caused by the sense amplifier circuit 151R is applied to the reference cell RC and the bit lines bRL and bGRL. When data is read from a selected cell MCk, an operation result of the sense amplifier circuit 151R is not output to the outside of the MRAM1.

The read driver 150R corresponding to the reference cell RC is connected to the control lines 491 and 492 and the voltage lines 991 and 992 common to the read driver 150 corresponding to the memory cell MC.

The read driver 150R includes a transistor TR3R and a transistor TR4R.

One end of each current path of the transistors TR3R and TR4R is connected to the reference bit line RL via the reference global bit line GRL and a column select switch (not shown).

The other end of the current path of the transistor TR3R is electrically connected to the voltage terminal (voltage line) 991. The read voltage VR1 is supplied to the voltage terminal 991. The other end of the transistor TR4R is electrically connected to the voltage terminal 992. The read voltage VR2 is supplied to the voltage terminal 992.

The read driver 150R may be configured using a single voltage source. In this case, a clamp transistor is provided between the read driver 150R and the global bit lines bGRL and RL. The first read voltage VR1 and the second read voltage VR2 are generated from a voltage VR2), output from a voltage source, by controlling the signal level of a control signal supplied to the gate of the clamp transistor.

The gate of the transistor TR3R is connected to the control line 491 common to a transistor TR3. The gate of the transistor TR4R is connected to the control line 492 common to a transistor TR4.

In the monitor circuits 400A and 400B, a threshold voltage (ON voltage) of the transistors 412 and 422 is set to approximately the voltage value (reference potential) Vref in FIG. 6. When the charging potentials of the bit lines bRL and bGRL reach the voltage value Vref, the transistors 412 and 422 are turned on.

(b) Operation Example

An operation example of the pulse width control circuit in the MRAM of this embodiment will be described with reference to FIG. 14.

FIG. 14 is a timing chart for explaining an operation example of the pulse width control circuit of the MRAM of this embodiment.

As described above, the MRAM1 of this embodiment executes read operation based on a command CMD.

At the start of the read operation (time t90), the potentials of the reference bit line bRL and the reference global bit line bGRL are at "L" level.

In the monitor circuits 400A and 400B, the N-type transistors 412 and 422 are turned off. The nodes NDa and NDb are electrically separated from the ground terminal 999 by the N-type transistors 412 and 422 in the OFF state.

Before the read operation, the read enable signals RE1 and RE2 are at the "L" level. In this case, the transistors 411 and 421 are turned on, and the transistors 413 and 423 are turned off. The nodes NDa and NDb are charged by the transistors 411 and 421 in the ON state. Thus, an initial state of the nodes NDa and NDb is set to "H" level.

At time t91, the control circuit 18 sets the read enable signal RE1 to the "H" level. Consequently, the transistor 413 is turned on, and the transistor 411 is turned off.

The node NDa is maintained in an initial state ("H" level state) by the transistor 418 and the inverter 419 as keeper circuits.

The AND gate 416 outputs a signal AND1 at the "H" level to the control line 491 by a signal at the "H" level in the node NDa and the signal RE1 at the "H" level.

In a period during which the read enable signal RE1 is set to the "H" level, the read enable signal RE2 is set to the "L" level. Thus, the AND gate 426 outputs the signal AND2 at the "L" level to the control line 492.

In the read drivers 150 and 150R, the transistors TR3 and TR3R are turned on by the signal AND1 at the "H" level. Thereby, the read drivers 150 and 150R supply the read voltage VR1 to a selected cell MC and the reference cell RC.

By the supply of the read voltage VR1, the reference cell RC outputs a current to the reference bit lines bRL and bGRL. Consequently, the reference bit lines bRL and bGRL are gradually charged.

When the potentials of the reference bit lines bRL and bGRL reach not less than the voltage value Vref (time t92), the transistor 412 is turned on in the monitor circuit 400A.

The node NDa is electrically connected to the ground terminal 999 by the transistors 412 and 413 in the ON state. Thus, the node NDa is discharged.

As a result, the potential of the node NDa changes to the "L" level.

When the signal at the "L" level (potential of the node NDa) is supplied to one of the input terminals of the AND gate 416, the calculation result of the AND gate 416 becomes "L" level.

The AND gate 416 outputs the signal AND1 at the "L" level to the control line 491. Consequently, in the drivers 150 and 150R, the transistors TR3 and TR3R are turned off. The supply of the read voltage VR1 is stopped by turning off the transistors TR3 and TR3R.

As described above, when output based on the resistance value between the resistance value of the MTJ element in the P state and the resistance value of the MTJ element in the AP state reaches the voltage Vref with the start of the first reading as the starting point, the supply of the read voltage is interrupted.

As a result, the pulse width of the read voltage VR1 is automatically controlled to a value W1 based on a certain reference voltage Vref (threshold voltage of the transistor 412).

Since the signal level of the signal RE2 is set to the "L" level in a period from the time t91 to the time t92 in the monitor circuit 400B, the signal level of the control signal AND2 is maintained at the "L" level in the period from the time t91 to the time t92. Thus, the transistors TR4 and TR4R are in the OFF state. The voltage VR2 is not supplied to the selected cell MCk and the reference cell RC by the transistors TR4 and TR4R in the OFF state.

After the supply of the read voltage VR1 is stopped, the control circuit 18 sets the signal level of the read enable signal RE1 to the "L" level at time t93. After the reference bit lines bRL and bGRL are discharged, the control circuit 18 starts the second reading.

When the potentials of the bit lines bRL and bGRL become the "L" level due to the discharge of the reference bit lines bRL and bGRL, the transistor 422 is turned off. The potential of the node NDb is maintained in an initial state ("H" level state) by the transistor 428 and the inverter 429 as keeper circuits.

At time t94, the control circuit 18 sets the read enable signal RE2 to the "H" level. By the signal RE2 at the "H" level, the transistor 423 is turned on, and the transistor 421 is turned off.

The AND gate 426 outputs the control signal AND2 at the "H" level to the control line 492 by a signal at the "H" level in the node NDb and the signal RE2 at the "H" level.

In the read drivers 150 and 150R, the transistors TR4 and TR4R are turned on by the control signal AND2 at the "H" level.

Thereby, the read drivers 150 and 150R supply the read voltage VR2 (VR2>VR1) to the selected cell MC and the reference cell RC.

As the read voltage VR2 is supplied, the reference bit line bRL and the reference global bit line bGRL are charged by the output of the reference cell RC.

At time t95 when the potentials of the reference bit line bRL and the reference global bit line bGRL reach approximately the voltage value Vref by the supply of the read voltage VR2, the transistor 422 is turned on. Since the voltage value of the second read voltage VR2 is higher than the first read voltage VR1, the potential of the reference global bit line bGRL reaches the voltage value Vref in a period shorter than the application time of the first read voltage VR1.

The node NDb is electrically connected to the ground terminal 999 via the transistors 422 and 423 in the ON state by turning on the transistor 422. Thus, the potential of the node NDb is set to the "L" level.

Consequently, a signal at the "L" level is supplied from node NDb to one of the input terminals of the AND gate 426.

The AND gate 426 outputs the signal AND2 at the "L" level to the control line 492 by a signal at the "L" level (potential of the node NDb) and the signal RE2 at the "H" level.

The signal AND2 at the "L" level is supplied to the transistors TR4 and TR4R via the control line 492. Consequently, the transistors TR4 and TR4R are turned off.

The supply of the read voltage VR2 is stopped by turning off the transistors TR4 and TR4R.

In this manner, when the charging potential due to the output of the reference cell RC reaches the potential Vref with the start of the second reading as the starting point, the supply of the read voltage VR2 is interrupted. As a result, the pulse width of the read voltage VR2 is automatically controlled to a value W2 based on a certain reference voltage Vref.

After the supply of the read voltage VR2 is stopped, the control circuit 18 sets the signal level of the read enable signal RE2 to the "L" level at time t96.

Thereafter, as described above, the data in the selected cell MCk is determined based on the results of the first reading and the second reading, and the determined data is read from the MRAM of this embodiment.

As described above, the MRAM of this embodiment can control the pulse widths of the read voltages VR1 and VR2 to desired values based on the monitoring result of the output of the reference cell RC.

As with the MRAM of this embodiment, the pulse width of the read voltage is controlled based on the monitoring result of the potential of a certain node at the time of the read operation, whereby a change in characteristics of the MTJ element according to a change in operation environment of the MRAM, such as a temperature, can be reflected in control of the pulse width of the read voltage. As a result, the MRAM of this embodiment can stabilize the read operation.

Accordingly, in the magnetic memory of this embodiment, operation characteristics of the memory can be improved.

(c) Modification

A modification of the MRAM of this embodiment will be described with reference to FIG. 15.

Figure 15:
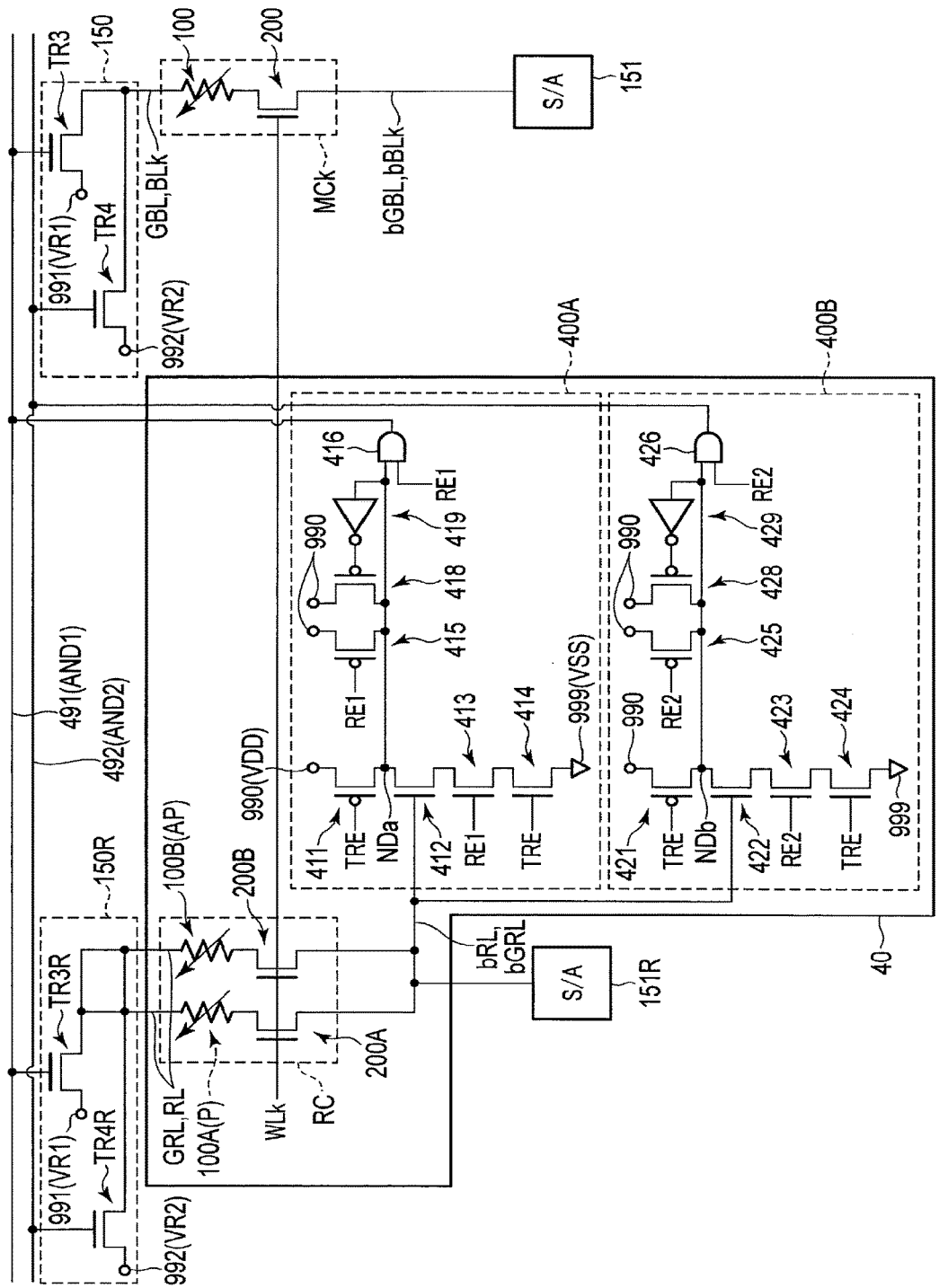
FIG. 15 is an equivalent circuit diagram showing the configuration example of the magnetic memory of the third embodiment.

FIG. 15 is an equivalent circuit diagram for explaining the modification of the MRAM of this embodiment.

In this modification, the internal configuration of the monitor circuit in the pulse width control circuit 400 is different from the example shown in FIG. 13.

In the monitor circuit 400A, an N-type transistor 414 and a P-type transistor 415 are provided.

One end of a current path of the transistor 414 is connected to the other end of the current path of the transistor 413. The other end of the current path of the transistor 414 is connected to the ground terminal 999. A control signal TRE is supplied to the gate of the transistor 414.

One end of a current path of the transistor 415 is connected to the power supply terminal 990. The other end of the current path of the transistor 415 is connected to the node NDa and one of the input terminals of the AND gate 416. The read enable signal RE1 is supplied to the gate of the transistor 415.

In this modification, the control signal TRE is supplied to the gate of the transistor 411.

In the monitor circuit 400B, an N-type transistor 424 and a P-type transistor 425 are provided.

One end of a current path of the transistor 424 is connected to the other end of the current path of the transistor 423. The other end of the current path of the transistor 424 is connected to the ground terminal 999. The control signal TRE is supplied to the gate of the transistor 424.

One end of a current path of the transistor 425 is connected to the power supply terminal 990. The other end of the current path of the transistor 425 is connected to the node NDb and one of the input terminals of the AND gate 426. The read enable signal RE2 is supplied to the gate of the transistor 425.

In this modification, the control signal TRE is supplied to the gate of the transistor 421.

The control signal TRE is a signal for determining whether adjustment (trimming) of the pulse widths W1 and W2 of the read voltages VR1 and VR2 with the use of the replica circuit 151R is to be executed or not. Hereinafter, the control signal TRE is referred to as the trimming enable signal TRE.

In this modification, the elements 418, 419, 428, and 429 as keeper circuits need not be provided.

In this modification, a pulse width adjustment circuit of FIG. 15 operates as follows.

When execution of the pulse width adjustment of the read voltages VR1 and VR2 with the use of the pulse width control circuit 40 is determined, the trimming enable signal TRE at the "H" level is supplied to the transistors 411, 414, 421, and 424.

By the signal TRE at the "H" level, the transistors 414 and 424 are turned on, and the transistors 411 and 421 are turned off.

Consequently, each of the monitor circuits 400A and 400B is set to a state capable of monitoring the potentials of the bit lines bRL and bGRL.

Thereafter, the first reading is executed.

Substantially as in the operation example shown in FIG. 14, the read enable signal RE1 is set to the "H" level, and the read enable signal RE2 is set to the "L" level.

By the signal RE1 at the "H" level, the transistor 413 is set to the ON state, and the transistor 415 is set to the OFF state. On the other hand, by the signal RE2 at the "L" level, the transistor 423 is set to the OFF state, and the transistor 425 is set to the ON state.

Here, since the potentials of the bit lines bRL and bGRL in a discharged state are supplied to the gates of the transistors 412 and 422 at the start of monitoring operation at the time of the first reading, an initial state of the transistors 412 and 422 is the OFF state.

The node NDa is electrically separated from the ground terminal 999 by the transistor 412 in the OFF state. Thus, even if the transistors 411 and 415 are in the OFF state, a charged state of the node NDa is maintained.

A signal at the "H" level corresponding to the potential of the node NDa is supplied to one of the input terminals of the AND gate 416. The signal RE1 at the "H" level is supplied to the other input terminal of the AND gate 416.

Thus, the AND gate 416 outputs the signal AND1 at the "H" level to the control line 491. The transistors TR3 and TR3R are turned on by a signal at the "H" level on the control line 491.

The read voltage VR1 is supplied to the selected cell MCk and the reference cell RC by the transistors TR3 and TR3R in the ON state.

As described with reference to FIG. 14, when the potentials of the reference bit lines bRL and bGRL reach the voltage value Vref by charging due to the supply of the read voltage VR1 due to the lapse of a certain period T1, the transistor 412 is turned on. Consequently, the node NDa is electrically connected to the ground terminal 999 via the transistors 412, 413, and 414 in the ON state and is discharged.

The potential at the "L" level of the node NDa is supplied to one of the input terminals of the AND gate 416.

Consequently, the AND gate 416 outputs the signal AND1 at the "L" level to the control line 491.

The transistors TR3 and TR3R are turned off by the signal AND1 at the "L" level on the control line 491. The supply of the read voltage VR1 is stopped by the transistors TR3 and TR3R in the OFF state.

As described above, the supply of the read voltage VR1 is controlled such that the pulse width W1 of the read voltage VR1 has a magnitude corresponding to the period T1 until the charging potentials of the bit lines bRL and bGRL reach the voltage value Vref.

In the monitor circuit 400B, the node NDb is electrically separated from the ground terminal 999 by the transistor 422 in the OFF state, and is electrically connected to the power supply terminal 990 by the transistor 425 in the ON state.

However, in the period (period for the first reading) during which the read enable signal RE1 is set to the "H" level, the read enable signal RE2 is set to the "L" level. Thus, the AND gate 426 outputs the signal AND2 at the "L" level to the control line 492. Accordingly, the supply of the second read voltage VR2 to the selected cell MCk and the reference cell RC is interrupted by the transistors TR4 and TR4R in the OFF state.

After discharging the bit lines bRL and bGRL, the second reading is executed.

In the monitor circuit 400A, after the read enable signal RE1 is set to the "L" level, the signal level of the read enable signal RE2 is set to the "H" level.

In the monitor circuit 400B, by the signal RE2 at the "H" level, the transistor 423 is turned on, and the transistor 425 is turned off.

The AND gate 416 outputs the signal AND1 at the "L" level by the signal RE1 at the L" level. Consequently, the transistors TR3 and TR3R are turned off. In this manner, at the time of the second reading, the supply of the first read voltage VR1 to the selected cell MCk and the reference cell RC is interrupted by the transistors TR3 and TR3R in the OFF state.

Since the potentials of the bit lines bRL and bGRL in the discharged state are supplied to the transistor 422 at the start of monitoring operation at the time of the second reading, the initial state of the transistor 422 is the OFF state.

The node NDb is electrically separated from the ground terminal 999 by the transistor 422 in the OFF state. The node NDb maintains the charged state before the second reading.

The AND gate 426 outputs the signal AND2 at the "H" level to the control line 492 by a signal at the "H" level in the node NDb and the signal RE2 at the "H" level. The transistors TR4 and TR4R are turned on by a signal at the "H" level on the control line 492.

The read voltage VR2 is supplied to the selected cell MCk and the reference cell RC via the transistors TR4 and TR4R in the ON state.

After the lapse of a certain period T2, when the potentials of the reference bit lines bRL and bGRL reach the voltage value Vref by charging due to the supply of the read voltage VR2, the transistor 422 is turned on. The node NDb is discharged by the transistors 422, 423, and 424 in the ON state. The potential at the "L" level of the node NDb is supplied to one of the input terminals of the AND gate 426.

Consequently, the AND gate 426 outputs the signal AND2 at the "L" level to the control line 492.

The transistors TR4 and TR4R are turned off by a signal at the "L" level on the control line 492. The supply of the read voltage VR2 to the selected cell MCk and the reference cell RC is stopped by the transistors TR4 and TR4R in the OFF state.

As described above, the supply of the read voltage VR1 is controlled such that the pulse width W2 of the read voltage VR2 has a magnitude corresponding to the period T2 until the charging potentials of the bit lines bRL and bGRL reach the voltage value Vref.

Thereafter, the data in the selected cell MCk is determined based on the results of the first reading and the second reading, and the determined data is read from the MRAM of this embodiment.

When the automatic adjustment of the pulse widths of the read voltages VR1 and VR2 by the pulse width control circuit 40 is not executed, the trimming enable signal TRE at the "L" level is supplied to the transistors 411, 414, 421, and 424.

The transistors 411 and 421 are turned on, and the transistors 414 and 424 are turned off; therefore, the charged state of the nodes NDa and NDb is maintained during the read operation.

Thus, the signal levels of the output signals AND1 and AND2 of the AND gates 416 and 426 change only according to the control of the signal levels of the read enable signals RE1 and RE2 by the control circuit 18.

As a result, the pulse widths of the read voltages VR1 and VR2 are controlled according to the control of the read enable signals RE1 and RE2 of the control circuit 18 based on setting information.

As described above, in the MRAM of this embodiment, even with the circuit configuration shown in FIG. 15, the pulse widths of the read voltages VR1 and VR2 can be controlled to desired values based on the monitoring result of the output of the reference cell RC by substantially the same operation (see FIG. 14) as the circuit shown in FIG. 13.

The MRAM1 of this embodiment having the pulse width control circuit 40 of FIG. 15 can control activation/deactivation of the pulse width control circuit 40 by the trimming enable signal TRE.

Consequently, in the MRAM of this embodiment, the presence or absence of automatic adjustment of the pulse widths W1 and W2 of the read voltages VR1 and VR2 can be selected as an operation option.

As described above, in the magnetic memory of this embodiment, the operation characteristics of the memory can be improved.

(4) Fourth Embodiment

A magnetic memory of the fourth embodiment will be described with reference to FIGS. 16 to 19.

FIG. 16 is an equivalent circuit diagram for explaining a configuration example of the magnetic memory of this embodiment.

In the magnetic memory (for example, MRAM) of this embodiment, the voltage mode differential amplification type sense amplifier circuit 151A is used as a sense amplifier circuit for data reading. Even when a voltage mode sense amplifier circuit is used in the MRAM of this embodiment, the MRAM of this embodiment can read data in a selected cell by the operation shown in FIGS. 5 to 9.

As shown in FIG. 16, the voltage mode sense amplifier circuit 151A is connected to the bit lines bBL and bGBL set to a low potential side at the time of the read operation. In the sense amplifier circuit 151A of FIG. 16, since a connection relation of the transistors TRa to TRf in the sense amplifier unit 50A is substantially the same as that of the example of FIG. 8, the explanation will be omitted here.

One end of a current path of the transistor TRg is connected to the node ND1, and the other end of the current path of the transistor TRg is connected to the ground terminal 999. A pre-discharge enable signal PDE1 is supplied from, for example, the control circuit 18 to the gate of the transistor TRg.

One end of a current path of the transistor TRh is connected to the node ND2, and the other end of the current path of the transistor TRg is connected to the ground terminal 999. A pre-discharge enable signal PDE2 is supplied from, for example, the control circuit 18 to the gate of the transistor TRg.

One end of a current path of an N-type transistor 609 is connected to the global bit line bGBL (or the bit line bBLk). The other end of the current path of the transistor 609 is connected to the ground terminal 999. A control signal VG is supplied from, for example, the control circuit 18 to the gate of the transistor 609. The transistor 609 clamps the potentials of the bit lines bBLk and bGBL according to the signal level of the control signal VG.

A connection between the sense amplifier circuit 151 and the global bit line bGBL is controlled by the switch elements SW1 and SW2.

In the voltage mode sense amplifier circuit 151A, the data in the selected cell MCk is determined and read based on the voltage drop amount of the bit line at the time of the application of the read voltage VR1 and the voltage drop amount of the bit line at the time of the application of the read voltage VR2.

At the time of the read operation, the signal VG at the "H" level is supplied to the gate of the transistor 609, and the transistor 609 is set to the ON state. Consequently, the potentials of the bit lines bBLk and bGBL are clamped.

Thereafter, the first read voltage VR1 and the second read voltage VR2 are supplied to the selected cell MCk by substantially the same operation as the above embodiment.

The potentials of the bit lines bBLk and bGBL at the time of the application of the first read voltage VR1 having the pulse width W1 vary in accordance with the voltage drop caused by the resistance value of the MTJ element 100 in the selected cell MCk. When the voltage VR1 is applied, electric charges corresponding to the variation of the potentials of the bit lines bBLk and bGBL are held in a capacitor 981.

The potentials of the bit lines bBLk and bGBL at the time of the application of the second read voltage VR2 having the pulse width W2 vary in accordance with the voltage drop caused by the resistance value of the MTJ element 100 in the selected cell MCk. When the voltage VR2 is applied, electric charges corresponding to the variation of the potentials of the global bit lines bBLk and bGBL are held in a capacitor 982.

The potentials of the capacitors 981 and 982 are transferred respectively to the nodes ND1 and ND2 in the sense amplifier unit 50A. The data in the selected cell MCk is determined based on the comparison result (magnitude relation of the potential) of the potentials of the nodes ND1 and ND2.

There is a possibility that an offset voltage for increasing and decreasing the voltage drop and the current value variation caused by the resistance value of the MTJ element 100 may be changed according to a ratio ($\alpha$=VR2/VR1) of the first read voltage VR1 and the second read voltage VR2. In order to correct this offset, a voltage conversion circuit 700 may be provided between the bit lines bBLk and bGBL and the capacitor 982. In the voltage conversion circuit 700, an output voltage of the voltage conversion circuit 700 is set to $1/\alpha$ of an input voltage of the voltage conversion circuit 700.

Consequently, the data in the selected cell MCk is read.

In the read voltages VR1 and VR2, the pulse width W1 and the pulse width W2 may have the same pulse width.

The read driver 150 may be driven by a single voltage source (voltage VRX). In this case, a clamp transistor is provided between the read driver 150 and the global bit lines GBL and BLk. The first read voltage VR1 and the second read voltage VR2 may be generated from the voltage VRX ($\geq$VR2) by controlling the signal level of the control signal VG supplied to the gate of the clamp transistor.

FIG. 17 is an equivalent circuit diagram of a sense amplifier circuit showing a modification of FIG. 16.

As shown in FIG. 17, the voltage mode sense amplifier circuit 151A may be connected to the bit lines BL and GBL set to a high potential side at the time of the read operation.

In this case, one end of the current path of the transistor 609 is connected to an output terminal of the read driver 150, and the other end of the current path of the transistor 609 is connected to the global bit line GBL (or the bit line BLk).

In the example of FIG. 17, the potentials of the bit lines BLk and GBL vary in accordance with the voltage drop caused by the resistance value of the MTJ element of the selected cell MCk when the read voltages VR1 and VR2 are supplied. Electric charges corresponding to the variation of the potentials of the bit lines BLk and GBL at the time of the application of the read voltages VR1 and VR2 are held in the capacitors 981 and 982.

Also in this example, the offset voltage for increasing and decreasing the voltage drop and the current value variation caused by the resistance value of the MTJ element 100 increases and decreases according to the ratio ($\alpha$=VR2/VR1) of the first read voltage VR1 and the second read voltage VR2. In order to correct the offset, a voltage conversion circuit (output voltage=input voltage/$\alpha$) may be provided between the global bit lines bBLk and bGBL and the capacitor 982.

The sense amplifier unit 50A compares the potentials of the capacitors 981 and 982, whereby the data in the selected cell MCk is read.

Figure 18:
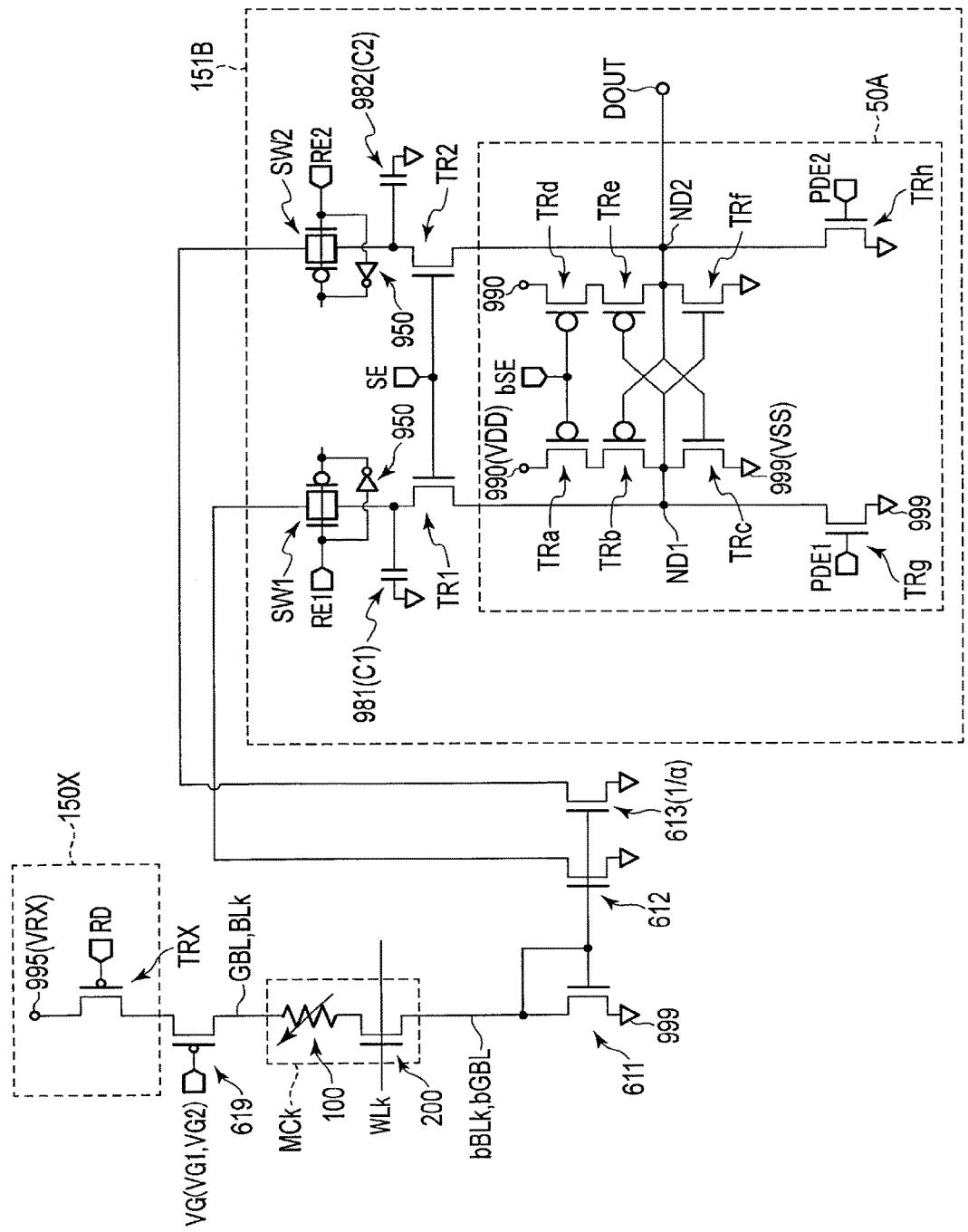

FIG. 18 is an equivalent circuit diagram showing a circuit configuration of a voltage mode sense amplifier circuit of the MRAM of this embodiment. A sense amplifier circuit 151E in FIG. 18 discriminates data in the selected cell by a method different from those in FIGS. 16 and 17.

The sense amplifier circuit 151B of FIG. 18 controls clamp voltages of the bit lines BL and GBL to control the magnitudes of the read voltages VR1 and VR2 applied to the selected cell MCk at the time of the first and second readings.

A read driver 150X includes a transistor TRX. One end of a current path of the transistor TRX is connected to a voltage terminal 995, and the other end of the current path of the transistor TRX is connected to the global bit line GBL (or the bit line bBLk). The voltage VRX ($\geq$VR2) is applied to the voltage terminal 995. A control signal RD is supplied to the gate of the transistor TRX.

For example, a current path of a transistor 619 is connected between the read driver 150X and the global bit line GBL.

The control signal VG is supplied from, for example, the control circuit 18 to the gate of the transistor 619. The signal level of the signal VG has a first level VG1 and a second level VG2 in addition to the signal level for setting the transistor 619 to the OFF state.

The first level VG1 has a voltage value for generating the first read voltage VR1 from a voltage VR. The second level VG2 has a voltage value for generating the second read voltage VR2 from the voltage VR. For example, an absolute value of the voltage value of the second level VG2 is larger than an absolute value of the voltage value of the first level VG1.

The pulse widths W1 and W2 of the read voltages VR1 and VR2 are controlled according to the supply periods of the signals VG1 and VG2.

An N-type transistor 611 is connected to the global bit line bGBL.

One end of a current path of the transistor 611 is connected to the global bit line bGBL and also to the gate of the transistor 611. The other end of the transistor 611 is connected to the ground terminal 999.

A gate of an N-type transistor 612 and a gate of an N-type transistor 613 are connected to the gate of the transistor 611.

One end of a current path of the transistor 612 is connected to one of input terminals of the sense amplifier circuit 151B. The other end of the current path of the transistor 612 is connected to the ground terminal 999.

One end of a current path of the transistor 613 is connected to the other input terminal of the sense amplifier circuit 151B. The other end of the current path of the transistor 613 is connected to the ground terminal 999.

Also in this example, there is a possibility that an offset for increasing and decreasing the voltage drop and the current value variation caused by the resistance value (resistance state) of the MTJ element 100 may occur according to the ratio (α=VR2/VR1) of the first read voltage VR1 and the second read voltage VR2. In order to correct the offset, the transistors 612 and 613 may be designed such that a relationship between the drive force of the transistor 612 and the drive force of the transistor 613 (for example, the gate width of the transistor) is α:1.

At the time of the read operation, the transistor TRX is set to the ON state by the signal RD at the "L" level, and the voltage terminal 995 is electrically connected to the global bit line GBL.

At the time of the first reading, the control signal VG of the signal level VG1 is supplied to the gate of the transistor 619 in a certain period corresponding to the pulse width W1 of the read voltage VR1. Consequently, the read voltage VR1 having the pulse width W1 is supplied to the selected cell MCk. When the voltage VR1 is applied, the potential of the global bit line bGBL varies according to the resistance value (resistance state) of the MTJ element 100 in the selected cell MCk.

The potential of the global bit line bGBL at the time of supplying the first read voltage VR1 is applied to the gates of the transistors 611, 612, and 613. Consequently, the transistors 612 and 613 pass a current corresponding to the potential of the global bit line bGBL. At the time of the first reading, the capacitor 981 is charged via the switch element SW1 in the ON state according to an output current of the transistor 612.

At the time of the second reading, the control signal VG of the signal level VG2 is supplied to the gate of the transistor 619 in a certain period corresponding to the pulse width W2 of the read voltage VR2. Consequently, the read voltage VR2 having the pulse width W2 is supplied to the selected cell MCk. When the voltage VR2 is applied, the potential of the global bit line bGBL varies according to the resistance value of the MTJ element 100 in the selected cell MCk.

The potential of the global bit line bGBL at the time of supplying the second read voltage VR2 is applied to the gates of the transistors 611, 612, and 613. Consequently, the transistors 612 and 613 pass a current corresponding to the potential of the global bit line bGBL. At the time of the second reading, the capacitor 982 is charged via the switch element SW2 in the ON state according to an output current of the transistor 613.

The sense amplifier unit 50A compares the potentials of the capacitors 981 and 982 according to the output currents of the transistors 612 and 613, whereby the data in the selected cell MCk is read.

In this way, the sense amplifier circuit 151B of FIG. 18 can determine data based on a difference in current according to two read voltage supply operations.

One of the read voltage VR1 and the read voltage VR2 may be directly applied to the voltage terminal 995 according to the operation state of the read operation without adjusting a gate voltage (the signal level of the signal VG) of the transistor 619.

In the two read voltages VR1 and VR2, the pulse width W1 and the pulse width W2 may have the same width.

FIG. 19 is an equivalent circuit diagram of the sense amplifier circuit showing a modification of FIG. 18.

As shown in FIG. 19, the sense amplifier circuit 151B may be connected to the global bit line GBL.

A current path of a P-type transistor 621 is connected between the transistor 619 and the read driver 150X.

The gate of the transistor 621, a gate of a P-type transistor 622, and a gate of a P-type transistor 623 are connected to one end of the current path of the transistor 619. The gates of the transistors 621, 622, and 623 are connected to the global bit line GBL via the current path of the transistor 619.

One end of each current path of the transistors 622 and 623 is connected to the voltage terminal 995.

One end of the current path of the transistor 622 is connected to one end of the capacitor 981 via the switch element SW1. One end of the current path of the transistor 623 is connected to one end of the capacitor 982 via the switch element SW2.

In the sense amplifier circuit 151B of FIG. 19, similarly to the example of FIG. 18, the first read voltage VR1 and the second read voltage VR2 are generated by controlling the signal level of the control signal VG supplied to the transistor 619.

The transistors 622 and 623 output current in accordance with the potential of the global bit line GBL due to the supply of the first and second read voltages VR1 and VR2 to the selected cell MCk. The capacitors 981 and 982 are charged according to output currents of the transistors of the read voltages VR1 and VR2.

Also in this example, there is a possibility that an offset for increasing and decreasing the voltage drop and the current value variation caused by the resistance value of the MTJ element 100 may occur according to the ratio (α=VR2/VR1) of the first read voltage VR1 and the second read voltage VR2. Thus, the offset may be corrected by performing setting such that the ratio of the drive force of the transistor 612 and the drive force of the transistor 613 (for example, the gate width of the transistor) is α:1.

The internal configuration of the sense amplifier circuit in FIGS. 16 to 19 is an example, and the internal configuration of the voltage mode sense amplifier circuit used in the MRAM of this embodiment is not limited to the internal configuration in FIGS. 16 to 19.

As described above, in the MRAM of this embodiment, even when a voltage mode sense amplifier circuit is used as a sense amplifier circuit, the data in the selected cell can be read by the self-reference method without destruction of the data in the selected cell.

(5) Fifth Embodiment

A magnetic memory of the fifth embodiment will be described with reference to FIGS. 20 and 21.

FIG. 20 is an equivalent circuit diagram for explaining a configuration example of the magnetic memory of this embodiment.

In the magnetic memory (for example, MRAM) of this embodiment, a current mode sense amplifier circuit is used as a sense amplifier circuit for data reading. Even when the current mode sense amplifier circuit is used in the MRAM of this embodiment, the MRAM of this embodiment can read data in a selected cell by the operation shown in FIGS. 5 to 9.

A sense amplifier circuit 151C of FIG. 20 is connected to the side of bit lines bBL and bGBL which are at a low potential at the time of read operation.

In the sense amplifier circuit 151C of FIG. 20, since a connection relation of a plurality of transistors TRa to TRf forming a flip-flop is substantially the same as that of the example of FIG. 8, the description will be omitted here.

A current path of an N-type transistor 630 is connected between the global bit line bGBL (or a bit line bBLk) and a ground terminal 999.

One end of a current path of an N-type transistor 631 is connected to the gate of the transistor 630 and the global bit line bGBL. The other end of the current path of the transistor 631 is connected to the gate of the N-type transistor 630. A read enable signal RE1 is supplied from a control circuit 18 to the gate of the transistor 631. The transistor 631 controls connection between a capacitor 981 and the global bit line bGBL.

One end of the capacitor 981 is connected to the other end of the current path of the transistor 631 and the gate of the transistor 630. The other end of the capacitor 981 is connected to the ground terminal 999.

One end of a current path of an N-type transistor 632 is connected to a node ND3 via a transistor TR1. The other end of the current path of the transistor 632 is connected to the ground terminal 999. The node ND3 is a connection node between a current path of the transistor TRa and a current path of the transistor TRb.

One end of a current path of an N-type transistor 633 is connected to the gate of the transistor 630 and the global bit line bGBL. The other end of the current path of the transistor 633 is connected to a gate of an N-type transistor 634. A read enable signal RE2 is supplied from the control circuit 18 to the gate of the transistor 633. The transistor 633 controls connection between a capacitor 982 and the global bit line bGBL.

One end of the capacitor 982 is connected to the other end of the current path of the transistor 633 and the gate of the transistor 634. The other end of the capacitor 982 is connected to the ground terminal 999.

One end of a current path of the N-type transistor 634 is connected to a node ND4 via a transistor TR2. The other end of the current path of the transistor 634 is connected to the ground terminal 999. The node ND4 is a connection node between a current path of the transistor TRd and a current path of the transistor TRe.

In place of the transistors 631 and 633, the switch elements SW1 and SW2 described above may be used.

At the time of the read operation, the sense amplifier circuit 151C outputs a current to the transistors 632 and 634.

The current mode sense amplifier circuit 151C continues to output the current at the time of data reading. The transistors 632 and 634 separate current paths between a selected cell MCk and the nodes ND3 and ND4. Consequently, read disturbs of the selected cell due to the current from the sense amplifier circuit 151C are suppressed.

At the time of the first reading using the first read voltage VR1 (when the signal VG is the signal level VG1), the capacitor 981 is charged via the transistor 631 in the ON state according to an output (current or charging potential) of the selected cell MCk.

Consequently, the capacitor 981 holds a potential corresponding to the output (current or charging potential) of the selected cell MCk to which the first read voltage VR1 is supplied.

At the time of the second reading using the second read voltage VR2 (when the signal VG is the signal level VG2), the capacitor 982 is charged via the transistor 633 in the ON state according to the output (current or charging potential) of the selected cell MCk.

Consequently, the capacitor 982 holds a potential corresponding to the output (current or charging potential) of the selected cell MCk to which the second read voltage VR2 is supplied.

After the transistors TR1 and TR2 are turned on, the transistors 632 and 634 are driven by the drive force of the transistor corresponding to the potentials of the capacitors 981 and 982. Consequently, the potentials of the nodes ND3 and ND4 vary in accordance with the potentials of the capacitors 981 and 982.

The potentials of the nodes ND1 and ND2 change in accordance with a relative magnitude relation between the nodes ND3 and ND4. The data in the selected cell MCk is determined based on a comparison result of the potentials of the nodes ND1 and ND2.

Consequently, the data in the selected cell MCk is read.

One of the read voltage VR1 and the read voltage VR2 may be directly applied to a voltage terminal 995 according to the operation state of the read operation without adjusting a gate voltage (the signal level of the signal VG) of a transistor 619. In the two read voltages VR1 and VR2, the pulse width W1 and the pulse width W2 may have the same width.

Also in this example, there is a possibility that an offset for increasing and decreasing the voltage drop and the current value variation caused by a resistance value of an MTJ element 100 may occur according to the ratio ($\alpha$=VR2/VR1) of the first read voltage VR1 and the second read voltage VR2. Thus, the offset may be corrected by setting the ratio of the drive force of the transistor 632 and the drive force of the transistor 634 (for example, the gate width of the transistor) to $\alpha$:1.

FIG. 21 is an equivalent circuit diagram of a current mode sense amplifier circuit different from the circuit of FIG. 20.

In a sense amplifier unit 50D of a sense amplifier circuit 151D of FIG. 21, since a connection relation of a plurality of transistors TRb, TRc, TRd, and TRe forming a flip-flop is substantially the same as that of the example of FIG. 8, the description will be omitted here. However, one end of the current path of the transistor TRb is connected to a power supply terminal 990, and the other end of the current path of the transistor TRe is connected to the power supply terminal 990.

The sense amplifier unit 50D includes N-type transistors TRj and TRk and P-type transistors TRx, TRy, and TRz.

One end of a current path of the transistor TRj is connected to a node ND5. The other end of the current path of the transistor TRj is connected to the ground terminal 999. One end of a current path of the transistor TRk is connected to a node ND6. The other end of the current path of the transistor TRk is connected to the ground terminal 999.

A signal SE is supplied to the gates of the transistors TRj and TRk.

The transistors TRj and TRk control the timing of latching an output from the selected cell in the sense amplifier circuit 151D.

One end of each current path of the transistors TRx and TRy is connected to the power supply terminal 990.

The other end of the current path of the transistor TRx is connected to the node ND1. The other end of the current path of the transistor TRy is connected to the node ND2. One end of a current path of the transistor TRz is connected to the node ND1, and the other end of the current path of the transistor TRz is connected to the node ND2.

A signal bPDE is supplied to the gates of the transistors TRx, TRy, and TRz.

The transistors TRx, TRy, and TRz control charging of the nodes ND1 and ND2.

As shown in FIG. 21, the sense amplifier circuit 151D is connected to the side of the bit lines bBL and bGBL which are at a high potential at the time of the read operation.

A current path of a P-type transistor 640 is connected between an output terminal of a read driver 150X and the transistor 619.

The gate of the transistor 640 is connected to the global bit line GBL via the current path of the transistor 619.

One end of a current path of an N-type transistor 641 is connected to the gate of the transistor 640 and the global bit line GBL. The other end of the current path of the transistor 641 is connected to a gate of an N-type transistor 642. The read enable signal RE1 is supplied from the control circuit 18 to the gate of the transistor 641. The transistor 641 controls connection between the capacitor 981 and the global bit line GBL.

One end of the capacitor 981 is connected to the other end of the current path of the transistor 641 and the gate of the transistor 642. The other end of the capacitor 981 is connected to the ground terminal 999.

One end of a current path of the transistor 642 is connected to the voltage terminal 995. The other end of the current path of the transistor 642 is connected to the node ND5 via the transistor TR1.

One end of a current path of an N-type transistor 643 is connected to the gate of the transistor 640 and the global bit line GBL. The other end of the current path of the transistor 643 is connected to a gate of an N-type transistor 644. The read enable signal RE2 is supplied from the control circuit 18 to the gate of the transistor 643. The transistor 643 controls connection between the capacitor 982 and the global bit line GBL.

One end of the capacitor 982 is connected to the other end of the current path of the transistor 643 and the gate of the transistor 644. The other end of the capacitor 982 is connected to the ground terminal 999.

One end of a current path of the transistor 644 is connected to the voltage terminal 995. The other end of the current path of the transistor 644 is connected to the node ND6 via the transistor TR2.

In place of the transistors 641 and 643, the switch elements SW1 and SW2 described above may be used.

The sense amplifier circuit 151D draws current at the time of the read operation.

The sense amplifier circuit 151D is electrically separated from a current path of the selected cell MCk by the transistors 642 and 644. Consequently, in the MRAM of this embodiment, even when the sense amplifier circuit 151D draws current into the circuit 151D during the read operation, it is possible to suppress flowing of current into the selected cell MCk due to the current drawing in the sense amplifier circuit 151D. As a result, the MRAM of this embodiment can prevent read disturbs due to the current of the sense amplifier circuit 151D.

Similarly to the example shown in FIG. 20, each of the capacitors 981 and 982 is charged according to the magnitude of the output of the selected cell at the time of the first and second readings.

After the transistors TR1, TR2, TRj, and TRk are turned on, the transistors 642 and 644 are driven according to the potentials of the capacitors 981 and 982.

Consequently, the potentials of the nodes ND5 and ND6 vary in accordance with the potentials of the capacitors 981 and 982.

The potentials of the nodes ND1 and ND2 change in accordance with a relative magnitude relation between the nodes ND5 and ND6. The data in the selected cell MCk is determined based on the comparison result of the potentials of the nodes ND1 and ND2.

Consequently, the data in the selected cell MCk is read.

Also in this example, there is a possibility that the offset for increasing and decreasing the voltage drop and the current value variation caused by the resistance value of the MTJ element 100 may occur according to the ratio ($\alpha$=VR2/VR1) of the first read voltage VR1 and the second read voltage VR2. In order to correct the offset, the ratio of the drive force of the transistor 642 and the drive force of the transistor 644 (for example, the gate width of the transistor) may be set to $\alpha$:1.

In the examples shown in FIGS. 20 and 21, an example is shown in which the first and second read voltages VR1 and VR2 are generated from the voltage VR by controlling the gate voltage VG of the transistor 619. However, as in the example shown in FIG. 8 and the like, the first and second read voltages VR1 and VR2 may be output to the selected cell from the voltage terminals 991 and 992 to which the voltages VR1 and VR2 are applied.

The internal configurations of the sense amplifier circuits 151C and 151D in FIGS. 20 and 21 are examples, and the internal configuration of the current mode sense amplifier circuit used in the MRAM of this embodiment is not limited to the internal configurations in FIGS. 20 and 21.

As described above, in the MRAM of this embodiment, even when a current mode sense amplifier circuit is used as a sense amplifier circuit, the data in the selected cell can be read by the self-reference method without destruction of the data in the selected cell.

(6) Other

In each of the embodiments described above, the read operation of the memory device has been described using MRAM as an example.

Each of the embodiments described above may be applied to a magnetic memory other than the MRAM as long as it is a magnetic memory using an MTJ element.

As long as a variable resistance element as a memory element has a voltage dependence with respect to a resistance value of an element in a certain resistance state, similarly to a magnetoresistive effect element, the read operation described in the present embodiment may be applied to a resistance change type memory using a variable resistance element other than the magnetoresistive effect element.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory comprising:
a first magnetoresistive effect element having a first resistance state or a second resistance state; and
a read circuit configured to apply a first read voltage to the first magnetoresistive effect element, hold a first charging potential caused by the first read voltage, apply a second read voltage higher than the first read voltage to the first magnetoresistive effect element, hold a second charging potential caused by the second read voltage, and determine whether the first magnetoresistive effect element is in the first resistance state or the second resistance state based on a comparison result between the first charging potential and the second charging potential.

2. The memory according to claim 1, wherein
a first pulse width of the first read voltage is wider than a second pulse width of the second read voltage.

3. The memory according to claim 2, wherein
the first and second pulse widths are set based on a first period during which a first potential reaches a first value and a second period during which a second potential reaches the first value,
the first potential is a potential between a charging potential caused by the first magnetoresistive effect element having the first resistance state at the time of applying the first read voltage and a charging potential caused by the first magnetoresistive effect element having the second resistance state at the time of applying the first read voltage, and
the second potential is a potential between a charging potential caused by the first magnetoresistive effect element having the first resistance state at the time of applying the second read voltage and a charging potential caused by the first magnetoresistive effect element having the second resistance state at the time of applying the second read voltage.

4. The memory according to claim 3, further comprising
a control circuit which controls the first pulse width and the second pulse width,
wherein
the control circuit comprises
a second magnetoresistive effect element having the first resistance state,
a third magnetoresistive effect element electrically connected in parallel to the second magnetoresistive effect element and having the second resistance state, and
first and second monitor circuits which monitor charging potentials caused by applying the first and read voltages to the second and third magnetoresistive effect elements.

5. The memory according to claim 4, wherein
at the time of applying the first read voltage, the first monitor circuit supplies a first signal to the read circuit when the charging potential reaches the first value,
the read circuit stops applying the first read voltage based on the first signal,
at the time of applying the second read voltage, the second monitor circuit supplies a second signal to the read circuit when the charging potential reaches the first value, and
the read circuit stops applying the second read voltage based on the second signal.

6. The memory according to claim 1, further comprising
a write circuit configured to supply a write current or a write voltage to the first magnetoresistive effect element in order to set a resistance state of the first magnetoresistive effect element to either the first resistance state or the second resistance state,
wherein after the resistance state of the first magnetoresistive effect element is judged, the write circuit sets the resistance state of the first magnetoresistive effect element to a resistance state that is the same as a judgment result of the resistance state of the first magnetoresistive effect element.

7. The memory according to claim 6, wherein
the resistance value of the first magnetoresistive effect element in the case where the first magnetoresistive effect element has the second resistance state is higher than the resistance value of the first magnetoresistive effect element in the case where the first magnetoresistive effect element has the first resistance state, and
when the resistance state of the first magnetoresistive effect element is the second resistance state, the write circuit supplies the write current or the write voltage to the first magnetoresistive effect element to set the resistance state of the first magnetoresistive effect element to the second resistance state.

8. The memory according to claim 1, wherein
the read circuit comprises
a first circuit which applies the first read voltage to the first magnetoresistive effect element based on a third signal, and
a second circuit which applies the second read voltage to the first magnetoresistive effect element based on a fourth signal.

9. The memory according to claim 1, wherein
the resistance value of the first magnetoresistive effect element in the case where the second read voltage is applied to the first magnetoresistive effect element having the second resistance state is lower than the resistance value of the first magnetoresistive effect element in the case where the first read voltage is applied to the first magnetoresistive effect element having the second resistance state.

10. The memory according to claim 1, wherein
the read circuit comprises
a first holder holding the first charging potential,
a second holder holding the second charging potential, a sensing portion including a first node electrically connected to the first holder and a second node connected to the second holder,
a first switch element electrically connected between the first holder and the first node, and
a second switch element electrically connected between the second holder and the second node.

11. The memory according to claim 10, wherein
the read circuit comprises
a third switch element electrically connected between the first magnetoresistive effect element and the first holder, and
a fourth switch element electrically connected between the first magnetoresistive effect element and the second holder,
when the first read voltage is applied, the third switch element is turned on, the fourth switch element is turned off,
when the second read voltage is applied, the third switch element is turned off, and the fourth switch element is turned on.

12. The memory according to claim 11, wherein
the third switch element is turned on by a first control signal at a first level and turned off by the first control signal at a second level,
the fourth switch element is turned on by a second control signal at the first level and turned off by the second control signal at the second level, and
a period during which the first control signal is set to the first level is longer than a period during which the second control signal is set to the first level.

13. The memory according to claim 10, wherein
the read circuit comprises
a first transistor having a first terminal electrically connected to the first magnetoresistive effect element and a first gate electrically connected to the first terminal,
a second transistor having a second gate electrically connected to the first gate and a second terminal electrically connected to the first holder, and
a third transistor having a third gate electrically connected to the first gate and a third terminal electrically connected to the second holder.

14. The memory according to claim 10, wherein
after the second read voltage is applied, the first and second switch elements are simultaneously turned on.

15. The memory according to claim 10, wherein
when the first charging potential is higher than the second charging potential, the potential of the first node is higher than the potential of the second node, and
when the first charging potential is lower than the second charging potential, the potential of the first node is lower than the potential of the second node.

16. The memory according to claim 10, wherein
the first and second nodes are set to a discharged state before the first read voltage is applied.

17. The memory according to claim 10, wherein
the read circuit comprises a third circuit between the second holder and the second node, and
an output signal of the third circuit is set to $1/\alpha$ of an input signal of the third circuit.

18. The memory according to claim 17, wherein
the $\alpha$ is a value based on a ratio of the first read voltage and the second read voltage.

19. The memory according to claim 1, wherein
the read circuit comprises
a first holder holding the first charging potential,
a second holder holding the second charging potential,
a sensing portion including a first node and a second node,
a first transistor having a first terminal electrically connected to the first magnetoresistive effect element and a first gate electrically connected to the first terminal,
a first switch element having a second terminal electrically connected to the first holder and a third terminal electrically connected to the first gate,
a second switch element having a fourth terminal electrically connected to the second holder and a fifth terminal electrically connected to the first gate,
a second transistor having a second gate electrically connected to the first holder and a sixth terminal electrically connected to the first node, and
a third transistor having a third gate electrically connected to the second holder and a seventh terminal electrically connected to the second node.

20. A memory system comprising:
the magnetic memory according to claim 1; and
a controller configured to transmit a command to the magnetic memory.

* * * * *